United States Patent
Sudo et al.

(10) Patent No.: US 7,671,382 B2
(45) Date of Patent: Mar. 2, 2010

(54) SEMICONDUCTOR DEVICE WITH THERMOPLASTIC RESIN TO REDUCE WARPAGE

(75) Inventors: Shingo Sudo, Tokyo (JP); Tatsuo Ota, Tokyo (JP); Nobutake Taniguchi, Tokyo (JP); Hiroshi Yoshida, Tokyo (JP); Hironori Kashimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/462,224

(22) Filed: Aug. 3, 2006

(65) Prior Publication Data
US 2007/0138624 A1 Jun. 21, 2007

(30) Foreign Application Priority Data
Dec. 19, 2005 (JP) ............................. 2005-364408

(51) Int. Cl.
*H01L 41/047* (2006.01)
(52) U.S. Cl. ................. 257/181; 257/632; 257/668; 257/671; 257/687; 257/688; 257/701; 257/702; 257/758; 257/e23.019; 257/e23.056; 257/e23.043; 257/e23.049; 257/e23.066; 257/e23.077; 257/e23.167; 257/e21.589
(58) Field of Classification Search .................. None
See application file for complete search history.

(56) References Cited

U.S. PATENT DOCUMENTS

| | | | | |
|---|---|---|---|---|
| 4,825,316 A | * | 4/1989 | Kishi et al. | 360/97.02 |
| 5,245,490 A | * | 9/1993 | Nishikawa | 360/75 |
| 5,698,898 A | * | 12/1997 | Matsumoto | 257/712 |
| 6,201,696 B1 | | 3/2001 | Shimizu et al. | |
| 6,255,672 B1 | | 7/2001 | Yoshioka et al. | |
| 6,259,157 B1 | * | 7/2001 | Sakamoto et al. | 257/723 |
| 6,597,063 B1 | * | 7/2003 | Shimizu et al. | 257/687 |
| 6,607,942 B1 | * | 8/2003 | Tsao et al. | 438/122 |
| 2003/0003629 A1 | | 1/2003 | Koike et al. | |
| 2004/0212056 A1 | * | 10/2004 | Chen et al. | 257/678 |

(Continued)

FOREIGN PATENT DOCUMENTS

JP 8-116006 5/1996

(Continued)

OTHER PUBLICATIONS

U.S. Appl. No. 11/535,684, filed Sep. 27. 2006, Kashimoto et al.

*Primary Examiner*—Ming-Loan T Tran
*Assistant Examiner*—Fei Fei Yeung Lopez
(74) *Attorney, Agent, or Firm*—Oblon, Spivak, McClelland, Maier & Neustadt, L.L.P.

(57) ABSTRACT

A semiconductor device which includes a radiating plate, a wiring patterned layer on the radiating plate via an insulating layer, at least one semiconductor chip mounted on the wiring patterned layer. The semiconductor chip has a surface electrode. The semiconductor device further includes a conductive lead plate electrically connected with the surface electrode of the semiconductor chip, and a resin package of thermoplastic resin having anisotropic linear expansion coefficient varying based upon directions. The resin package covers the wiring patterned layer, the semiconductor chip, the conductive lead plate, and at least a portion of the radiating plate. The conductive lead plate extends in a direction which provides the resin package with the maximum linear expansion coefficient. In the semiconductor device so structured, the warpage of the resin package is reduced both in longitudinal and transverse directions.

9 Claims, 17 Drawing Sheets

U.S. PATENT DOCUMENTS

2005/0163982 A1* 7/2005 Ono et al. .................. 428/209
2005/0212182 A1* 9/2005 Yokoyama et al. .......... 264/496

FOREIGN PATENT DOCUMENTS

| | | |
|---|---|---|
| JP | 11-145342 | 5/1999 |
| JP | 11-220074 | 8/1999 |
| JP | 2000-31378 | 1/2000 |
| JP | 2001-257291 | 9/2001 |
| JP | 2003-318333 | 11/2003 |
| JP | 2004-228461 | 8/2004 |

* cited by examiner

SEMICONDUCTOR DEVICE WITH THERMOPLASTIC RESIN TO REDUCE WARPAGE

BACKGROUND OF THE INVENTION

1) Technical Field of the Invention

The present invention relates to a semiconductor device, and in particular, relates to the semiconductor device having a resin package formed by molding with thermoplastic resin, which reduces warpage of the resin package.

2) Description of Related Arts

Conventional power semiconductor devices such as a power module are, in general, categorized into two types of semiconductor devices. That is, one is a case-type semiconductor device having a case which is filled up with gel resin after a semiconductor chip is mounted on an insulating substrate in the case, and another one is a mold-type semiconductor device having a resin package which is molded with resin covering the semiconductor chip mounted on the insulating substrate. Also, the mold-type semiconductor device is further grouped into two of sub-groups, i.e., one formed by transfer-molding with thermosetting resin and another made by injection-molding with thermoplastic resin.

Unlike the case-type semiconductor device, the mold-type semiconductor device can eliminate manufacturing steps for securing the case on the insulating substrate and for filling in the case with gel resin, but it may have a problem that the resin package warps during hardening due to difference of linear thermal expansion coefficients between the resin package and various components such as the radiating plate and the semiconductor chip covered by the resin package. This may cause breakdown of the insulating substrate covered by the resin package, or may define a gap between the warped radiating plate and the external heat sink, thereby reducing radiation efficiency.

Among those mold-type semiconductor devices, a hybrid integrated circuit device formed by molding with thermoplastic resin is disclosed in a Japanese Patent Application, JPA 11-330317, having a patent family of a United Stated Patent, U.S. Pat. No. 6,259,157, which is incorporated herein by reference and referred to as "Reference 1". Also, Reference 1 suggests that when injection-molding with the thermoplastic resin containing fiber glass, the direction of injection from a resin inlet is important, and also, in case where the resin package is elongated and has longer and shorter sides, in particular, the thermoplastic resin is to be injected from the resin inlet provided on the shorter side in the direction along the longer side so as to prevent the warpage of the resin package and the base plate. Thus, Reference 1 teaches that the thermoplastic resin mixed with fiber glass is injected in the direction along the longer side to orient the elongated fiber glass in the same longitudinal direction, thereby improving mechanical strength of the resin package along the longitudinal direction and reducing the warpage of the resin package.

In the meantime, a Japanese Patent Application, JPA 2003-318333, which is referred to as "Reference 2", discloses another hybrid integrated circuit device formed by transfer-molding the thermosetting resin, in which the insulating resin package has grooves on the top surface thereof to avoid the warpage of the metal base plate. Reference 2 also teaches, as the reasons of the warpage, that the insulating resin is filled, hardened, and integrated with the base plate more quickly in the regions adjacent where the grooves are formed, and that the insulating resin close to the grooves has various angles to the mounting surface of the metal base plate.

However, in Reference 1, while the fiber glass of the resin package that is oriented in the longitudinal direction prevents the longitudinal warpage of the resin package, the linear expansion coefficient along the transverse direction perpendicular to the orienting direction of the fiber glass, which is substantially greater than one along the longitudinal direction, causes the warpage of the resin package and the base plate along the transverse direction. Therefore, Reference 1 cannot prevent, in the transverse direction, the breakdown of the insulating substrate and the reduction of radiation efficiency (due to the gap between the radiating plate and the external heat sink).

Also in Reference 2, the insulating resin filled and hardened more quickly adjacent the grooves is expected to improve stiffness encountering the stress that warps the resin package. However, in case that the thermoplastic resin is used, the cure temperature is lower and the cure time is longer than those when the thermosetting resin is utilized, therefore, the stiffness or mechanical strength of the transfer-molded resin package cannot be improved by forming the grooves on the insulating resin as Reference 2. It should be noted that Reference 2 describes nothing about the resin package formed by molding with the thermoplastic resin.

To address the aforementioned drawbacks, the present invention was made having one of purposes to provide a semiconductor device which can reduce the warpage of the resin package not only in the longitudinal direction but also transverse direction (the direction perpendicular to the orienting direction of the fiber glass).

SUMMARY OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

One of the aspects of the present invention is to provide a semiconductor device, which includes a radiating plate, a wiring patterned layer on the radiating plate via an insulating layer, at least one semiconductor chip mounted on the wiring patterned layer. The semiconductor chip has a surface electrode. The semiconductor device further includes a conductive lead plate electrically connected with the surface electrode of the semiconductor chip, and a resin package of thermoplastic resin having anisotropic linear expansion coefficient varying based upon directions. The resin package covers the wiring patterned layer, the semiconductor chip, the conductive lead plate, and at least a portion of the radiating plate. The conductive lead plate extends in a direction which provides the resin package with the maximum linear expansion coefficient.

In the semiconductor device so structured, the warpage of the resin package can be reduced both in longitudinal and transverse directions.

BRIEF DESCRIPTION OF THE DRAWINGS

The present invention will more fully be understood from the detailed description given hereinafter and accompanying drawings which are given by way of illustration only, and thus are not limitative of the present invention.

DETAILED DESCRIPTION OF THE PREFERRED EMBODIMENTS

Figure 1:
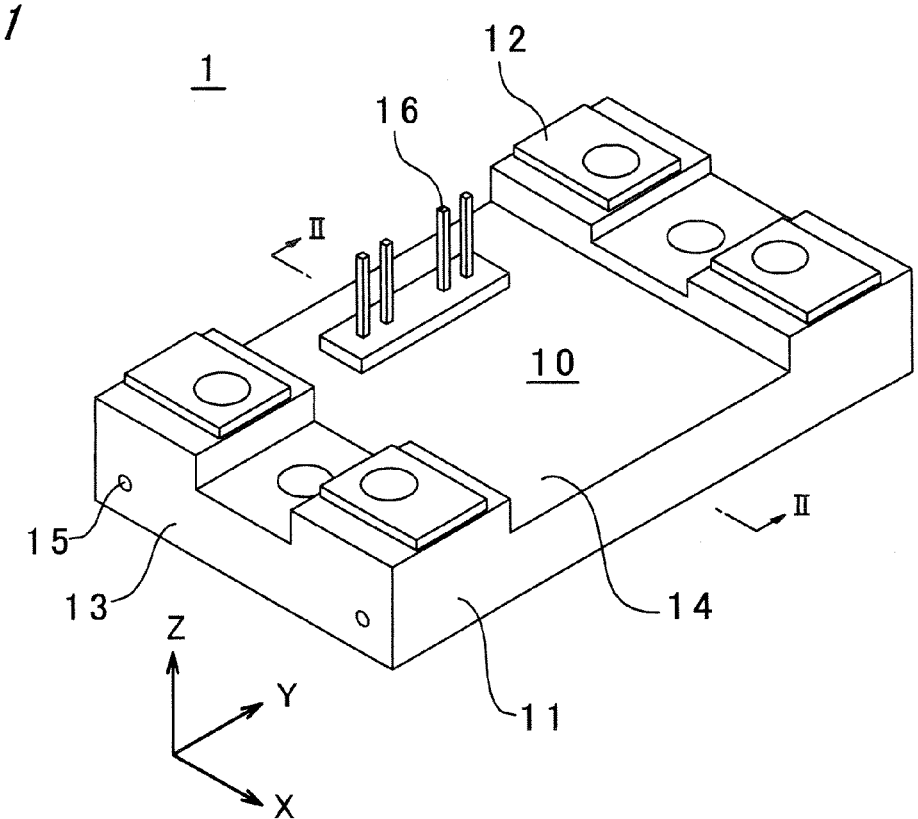
FIG. 1 is a perspective view of a semiconductor device according to the first embodiment of the present invention.

Referring to the attached drawings, the details of embodiments according to the present invention will be described hereinafter. In those descriptions, although the terminology indicating the directions (for example, "X-", "Y-", "Z"-directions, "top" and "bottom") are conveniently used just for clear understandings, it should not be interpreted that those terminology limit the scope of the present invention.

Embodiment 1

Referring to FIGS. 1-6, a mold-type semiconductor device according to the first embodiment of the present invention will be described herein. The semiconductor device 1 illustrated in FIG. 1 includes, in general, a resin package 10 formed by injection-molding with the thermoplastic resin, a plurality of main terminals 12 on the resin package 10, and a plurality of signal terminals 16 extending from the top surface 14 of the resin package 10. Although the resin package 10 of the present invention is preferably made of thermoplastic resin including, for example, polyphenylene sulfide (PPS) mixed with reinforcing material such as fiber glass, other thermoplastic resin can be used including polybutylene terephthalate (PBT) resin and liquid crystal polymer (LCP).

Also, the semiconductor device 1 of the present embodiment includes a radiating plate (base plate) 20, a wiring patterned layer 24 secured on the radiating plate via an insulating layer 22, and at least one semiconductor chip mounted on the wiring patterned layer 24 via a solder layer (not shown). It should be noted that in the subsequent embodiments, an insulating gate bipolar transistor chip 26 and a free wheel diode chip 28 (which are simply referred to as the IGBT chip 26 and FWD chip 28, respectively) are described as examples of the semiconductor chip, other semiconductor chips may be used, or single or three or more semiconductor chips may be utilized. For clarity of FIG. 2, the resin package 10 of the thermoplastic resin is illustrated without hatching thereof.

Although the present invention is not limited by material composing the above-described components, for example, the radiating plate 20 is made of metal such as aluminum having good thermal conductivity, and the insulating layer 22 is formed of epoxy resin (adhesive agent) mixed with thermally conductive filler such as silica. Also, the wiring patterned layer 24 is integrally secured on the radiating plate 20 via the insulating layer 22.

Figure 3:
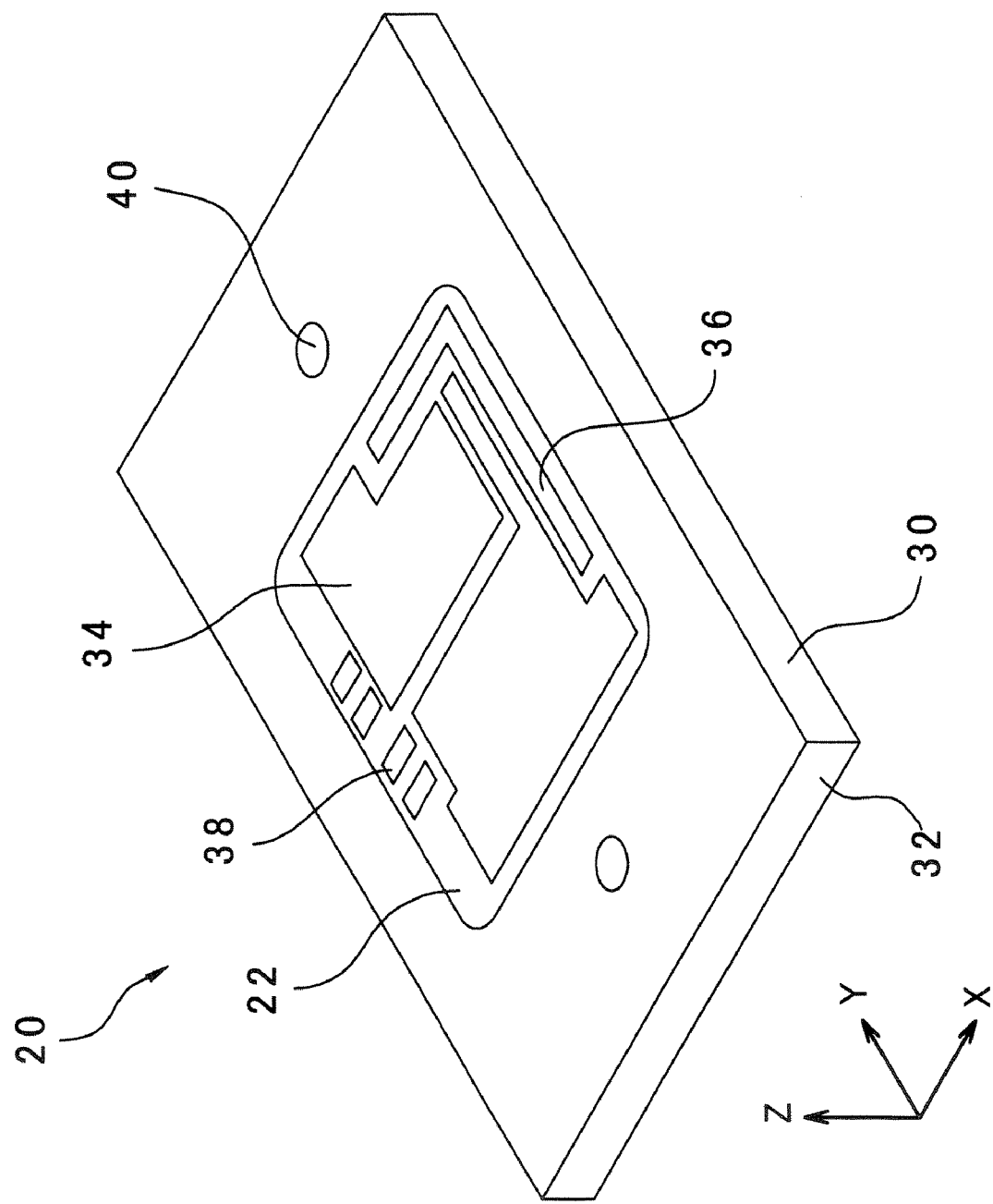
FIG. 3 is a perspective view of the radiating plate of the first embodiment.

Referring to FIG. 3, the radiating plate 20 has a planner rectangular configuration defined by two pairs of opposing ends 30, 32 extending in longitudinal and transverse directions (Y and X directions), respectively. As above, the insulating layer 22 is deposited on the radiating plate 20. Also, formed on the insulating layer 22 is the wiring patterned layer 24 including a pair of island patterned layers 34, an elongated lead patterned layer 36, and a plurality of terminal patterned layers 38. Thus, the semiconductor device 1 of the first embodiment includes a single phase of high- and low-potential inverter circuitries, i.e., a pair of the IGBT chips 26 and FWD chips 28, mounted on the island patterned layers 34. Also, each of the terminal patterned layers 38 is electrically connected with respective one of the control electrodes 27 of the IGBT chips 26 (see FIG. 4).

Also as shown in FIG. 3, the radiating plate 20 includes a pair of through-holes 40, each receiving a screw for connecting the semiconductor device 1 with the heat sink via silicone grease intervened between the radiating plate 20 and the heat sink.

Figure 4:
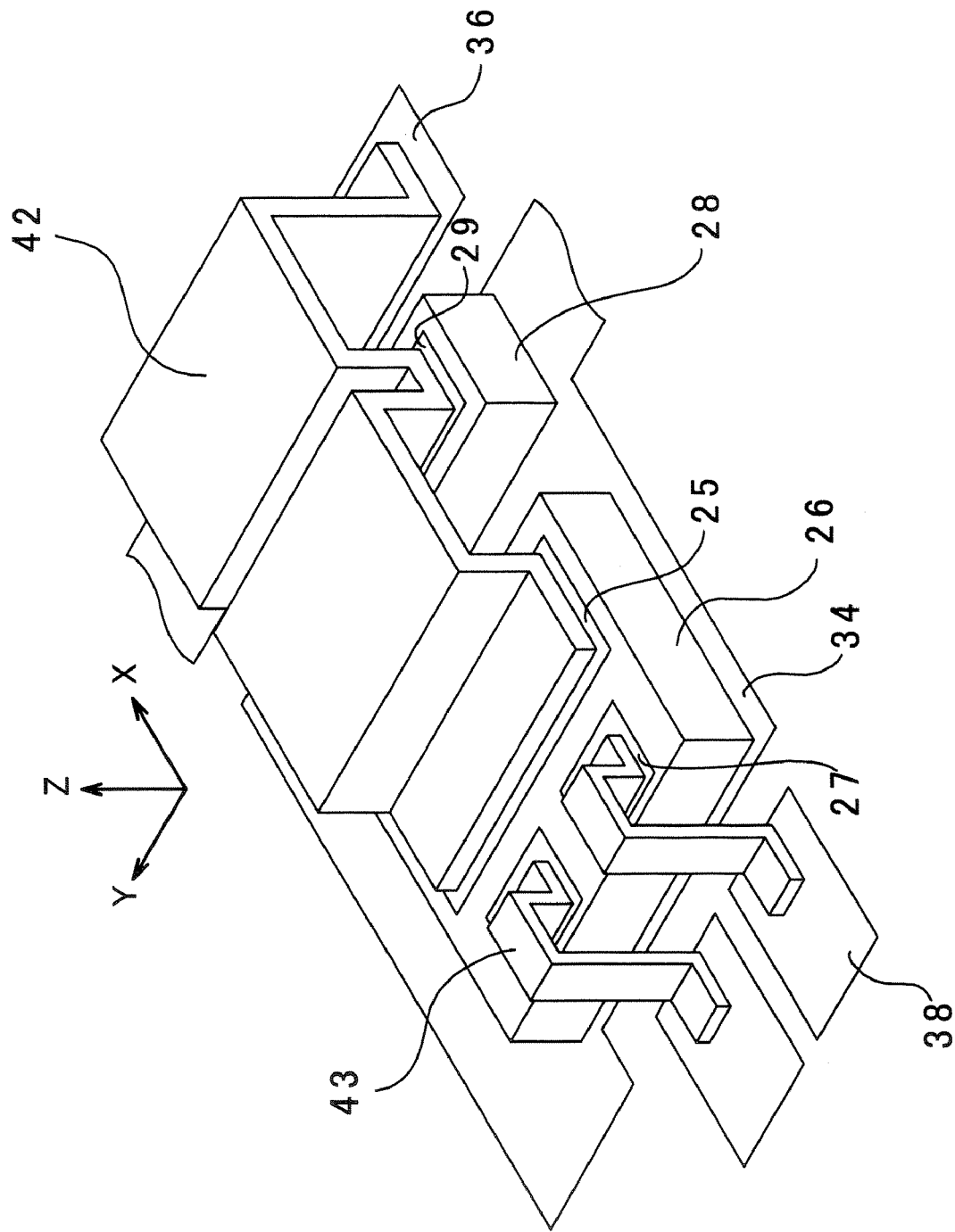
FIG. 4 is a perspective view of the semiconductor chips and the conductive lead plate assembled on the radiating plate.

As clearly illustrated in FIG. 4, the IGBT chip 26 and the FWD chip 28 are mounted on the island patterned layer 34 via the solder layer (not shown). The IGBT chip 26 includes a collector electrode (not shown) on the bottom surface facing downwardly to the island patterned layer 34, an emitter electrode 25 opposing to the collector electrode, and at least one control electrode 27 such as a gate electrode and a current-sensing electrode. The FWD chip 28 includes a cathode electrode (not shown) on the bottom surface facing downwardly to the island patterned layer 34, and an anode electrode 29 opposing to the cathode electrode. The collector and cathode electrodes are electrically connected with the island pattered layer 34 via the solder layer. In the present specification, the emitter electrode 25, the control electrode 27, and the anode electrode 29 are collectively referred to as surface electrodes.

According to the present embodiment, the emitter electrode 25 and the anode electrode 29 are electrically connected with the lead patterned layer 36 through a conductive lead plate (also referred to as a "direct lead") 42 and the solder layer (not shown) Thus, the IGBT chip 26 and the FWD chip 28 are reversely connected in parallel to form the inverter circuitry. Also, the control electrode 27 of the IGBT chip 26 is electrically connected with the terminal patterned layer 38 on the insulating layer 22 through another conductive lead plate 43 and the solder layer (not shown). The aforementioned solder layer is made of solder including, for example, Sn—Ag—Cu based solder, typical solder having base material of Sn, and Au—Sn based high heat-resistive solder, or any other conductive adhesives.

In switching operation of the semiconductor device 1 so structured, heat generated from the IGBT chip 26 and the FWD chip 28 is transmitted to the wiring patterned layer 24, the insulating layer 22, and the radiating plate 20, and is radiated through the silicone grease from the external heat sink in an effective manner.

Although the present invention is not limited by size of the above-described components, for example, the radiating plate 20 shown in FIG. 3 is sized with 40 mm, 70 mm, and 2 mm in X-, Y-, and Z-directions, respectively. In FIG. 4, the IGBT chip 26 is sized with 7.5 mm, 9 mm, and 250 μm in X-, Y-, and Z-directions, respectively, also the FWD chip 28 is sized with 4 mm, 9 mm, and 250 μm in X-, Y-, and Z-directions, respectively. The conductive lead plate 42 is sized with 7.5 mm or less and 300 μm in Y- and Z-directions, respectively.

After assembling the radiating plate 20, the insulating layer 22, the wiring patterned layer 24 and the semiconductor chips 26, 28 as above, the resin package 10 is formed by injection-molding with the thermoplastic resin such that the bottom surface 20 of the radiating plate 20 is exposed. The resin package 10 has a top surface 14 and a bottom surface opposing thereto (FIG. 2), and as shown in FIG. 1, has a planner rectangular configuration defined by two pairs of the opposing sides 11, 13 extending in longitudinal and transverse directions (Y and X directions), respectively. The resin package 10 is formed by injecting the resin from the resin inlet 15 provided on one side 13 extending in the transverse direction (X-direction) towards the longitudinal direction (Y-direction).

As above, the thermoplastic resin includes, for example, polyphenylene sulfide (PPS) mixed with reinforcing material such as fiber glass, and in case where the thermoplastic resin is injected along the longitudinal direction (Y-direction), the elongated fiber glass in the thermoplastic resin has feature or tendency to be oriented along the longitudinal direction (Y-direction).

Figure 5A:
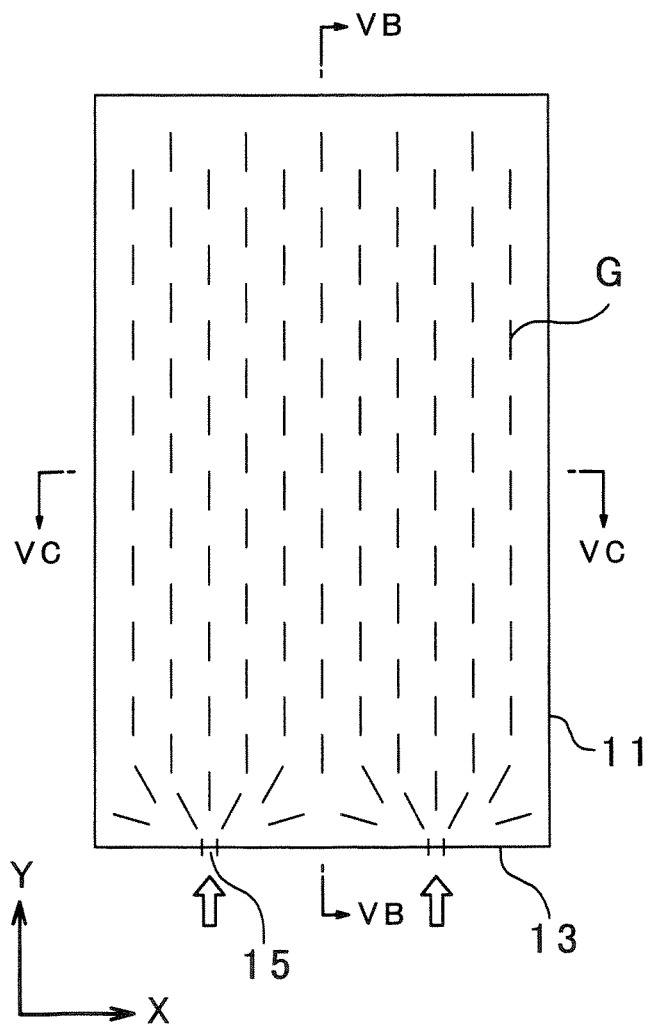
FIGS. 5A, 5B and 5C are top plan, side and elevational views of the resin package of thermoplastic resin mixed with fiber glass.

To this result, the resin package 10 formed by injection-molding with the thermoplastic resin containing reinforcing material such as fiber glass exhibits the anisotropy in the linear thermal expansion coefficient varying based upon directions. When injecting the resin towards the longitudinal direction from the resin inlet 15 provided on the side 13 extending in the transverse direction, the fiber glass G is ideally oriented and aligned as illustrated in FIG. 5A. However, in practical, the flow of the thermoplastic resin impinges on the various components covered in the resin package including semiconductor chips 26, 28 and the conductive lead plate 42 so that the orienting directions of the fiber glass are more or less interfered in some local regions. Nevertheless, among all of the directions, the longitudinal direction (Y-direction) still provides the resin package 10 with the minimum linear expansion coefficient, compared to the transverse direction (X-direction).

Thus, the linear thermal expansion coefficient of the resin package 10 along the orienting direction (Y-direction) of the glass fiber is likely much smaller than one along the direction (X-direction) perpendicular to the orienting direction. In particular, the resin package 10 includes the linear expansion coefficient of about $20 \times 10^{-6}$/K in the orienting direction (Y-direction) and the linear expansion coefficient of about $40 \times 10^{-6}$/K in the transverse direction (X-direction) perpendicular to the orienting direction.

Figure 5B:
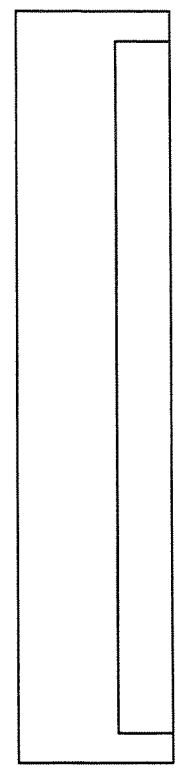

In the meanwhile, the aluminum composing the radiating plate 20 has the linear expansion coefficient of about $23 \times 10^{-6}$/K, which is close to one of the resin package 10 along the longitudinal direction (Y-direction). Therefore, such equivalent linear expansion coefficients in the longitudinal direction (Y-direction) allows the resin package 10 and the radiating plate 20 to expand and shrink along the longitudinal direction in a similar manner, in accordance with the peripheral temperature. This causes no or little warpage of the resin package 10 appeared in the longitudinal direction (Y-direction), as shown in FIG. 5B. On the other hand, in the direction providing the resin package 10 with the maximum linear expansion coefficient, i.e., in the transverse direction (X-direction) perpendicular to the orienting direction (Y-direction) of the fiber glass G, the linear expansion coefficient of the resin package 10 is substantially greater than that of the radiating plate 20. This causes the degree or amount of the shrinkage of the resin package 10 to be much greater than that of the radiating plate 20, thereby warping the resin package 10 and the radiating plate 20, as illustrated in FIG. 5C.

It should be noted that when the radiating plate made of copper is used for assembling the semiconductor device, since the linear expansion coefficient of cooper is about $17 \times 10^{-6}$/K, the resin package 10 is also warped in the transverse direction (X-direction).

Figure 5C:
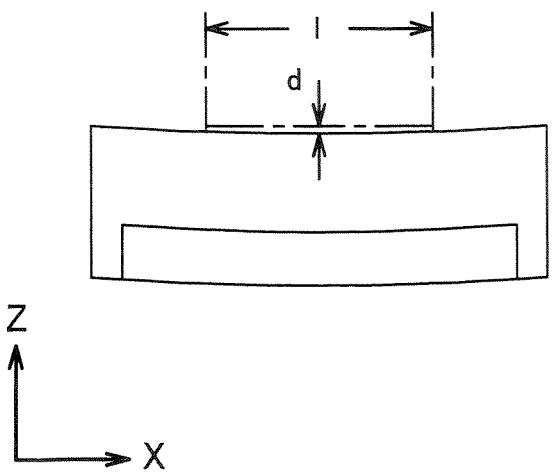

As shown in FIG. 5C, the present inventors have found the warpage (d) of about 80-100 μm for a distance (l) of 30 mm in the middle region of the resin package 10 along the transverse direction (X-direction). This warpage of the resin package 10 may cause the breakdown of the insulating layer 22 encompassed within the resin package 10, and/or may define the gap between the radiating plate 20 and the external heat sink, thereby reducing the radiation efficiency.

However, according to the present embodiment, the conductive lead plate 42 of metal such as copper having the low coefficient of linear expansion is arranged adjacent the top surface 14 of the resin package 10, extending in the direction which provides the resin package 10 with the maximum linear expansion coefficient. Thus, the conductive lead plate 42 gives strength or force encountering the shrinking stress of the resin package 10 in the transverse direction (X-direction) that is applied during the cooling and hardening step so as to reduce the shrinking stress and the warpage of the resin package 10 in the transverse direction (X-direction).

The present inventors also have found that the warpage (d) of the resin package 10 for the same distance (l) of 30 mm in the transverse direction (X-direction) can be reduced to about 40 μm or less in accordance with the present embodiment.

As described above, in the view point for reducing the warpage of the resin package 10, it is preferable that the conductive lead plate 42 is made of material having the linear expansion coefficient equal to or less than that of metal such as copper and aluminum composing the radiating plate 10, and also that the conductive lead plate 42 is arranged closer to the top surface 14 of the resin package 10.

For example, the material composing the conductive lead plate 42 may be nickel iron alloy including so-called 42-Alloy (42% Ni-58% Fe) and Inver (36% Ni-64% Fe) having the linear expansion coefficients of $41 \times 10^{-7}$/K and $13 \times 10^{-7}$/K, respectively. The nickel iron alloy is known to have the electrical conductivity lower than copper, therefore, a copper layer may be deposited on the conductive lead plate 42 as a cladding layer so as to improve the electrical conductivity of the conductive lead plate 42.

Also, in order to further reduce the degree of the warpage of the resin package 10, the conductive lead plate 42 may be arranged close to the top surface 14 of the resin package 10 such that the gap between the top surface 14 and the conductive lead plate 42 is one-third or less of the space between the top surface 14 and the radiating plate 20.

Figure 2:
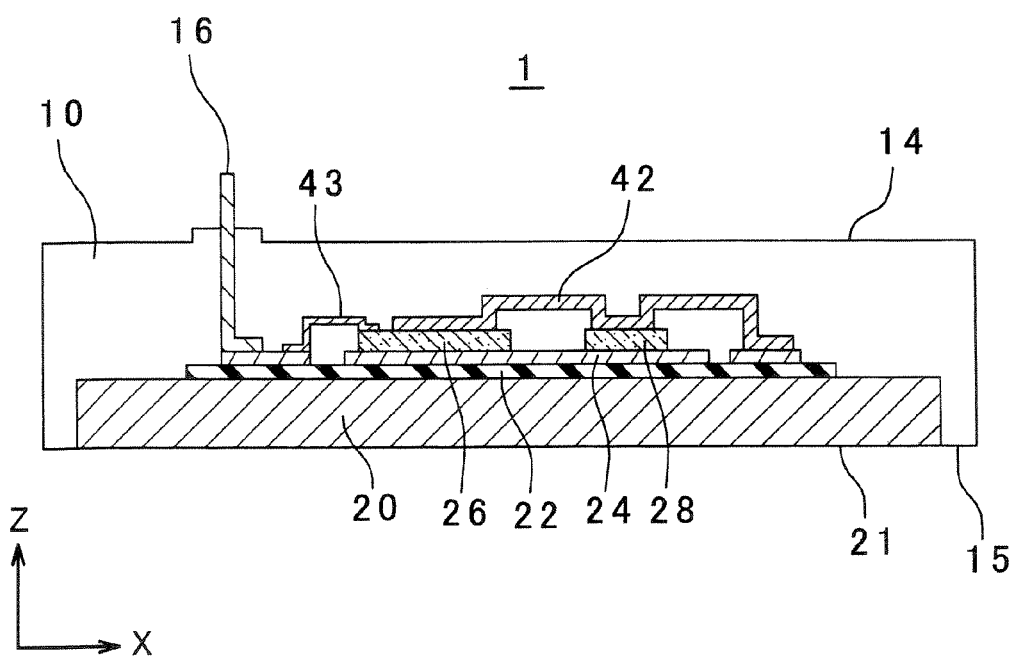
FIG. 2 is a cross sectional view taken along a line II-II of FIG. 1.

In the foregoing description, the conductive lead plates 42, 43 are formed by bending the plate-like member to minimize the cross section shown in FIG. 2, for avoiding the turbulence of the fiber glass in the thermoplastic resin injected in the longitudinal direction (Y-direction), thereby optimizing the low linear expansion coefficient in the longitudinal direction (Y-direction).

Figure 6:
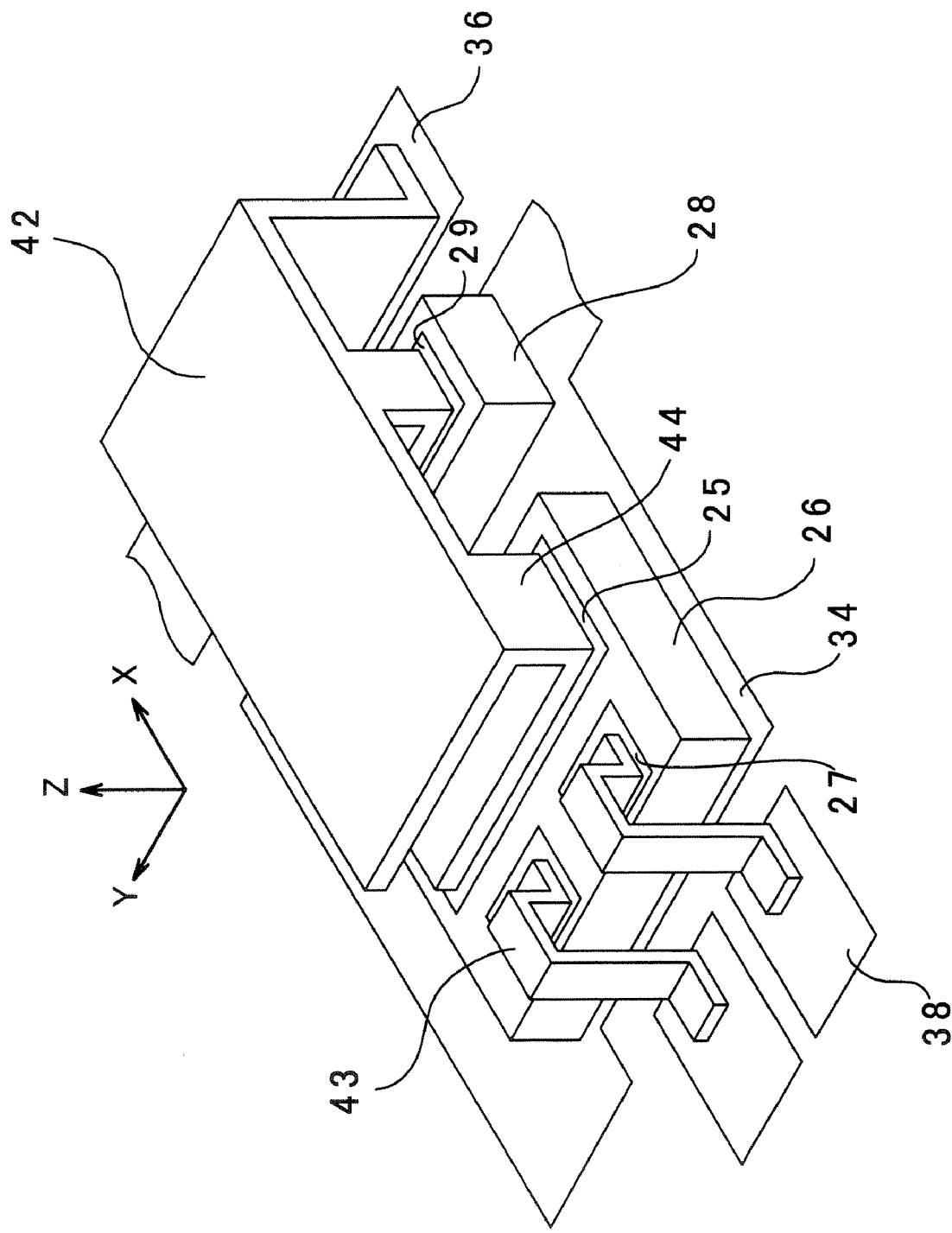
FIG. 6 is a perspective view of another conductive lead plate, which is similar to FIG. 4.

Meanwhile, as illustrated in FIG. 6, the conductive lead plates 42 may have wall portions 44 provided adjacent the emitter electrode 25 of the IGBT chip 26 and the anode electrode 29 of the FWD chip 28, and each of the wall portions extends in a X-Z plane perpendicular to the longitudinal direction (Y-direction) in which the thermoplastic resin is injected. The wall portions 44 of the conductive lead plates 42 disarrange the orientation of the fiber glass in the thermoplastic resin and locally normalize the anisotropy in the linear expansion coefficient of the resin package 10. Thus, while the maximum anisotropy of the linear expansion coefficient of the resin package 10 as a whole is obtained in the transverse direction (X-direction), the orientation of the fiber glass is disarranged in the local region of the resin package 10 adjacent the emitter electrode 25 and the anode electrode 29, where the warpage of the resin package 10 along the longitudinal direction (Y-direction) is increased and the warpage along the transverse direction (X-direction) is decreased. Therefore, normalization of the anisotropy in the linear expansion coefficient of the resin package 10 around the semiconductor chips 26, 28 reduces the stress applied thereto in the transverse direction (X-direction), thereby preventing the breakdown of the semiconductor chips 26, 28.

According to the conventional technique, the emitter electrode 25 of the IGBT chip 26 and the anode electrode 29 of the FWD chip 28 are electrically connected with the lead patterned layer 36, for example, through a plurality of aluminum wires (not shown) each having a diameter of 300 μm. In the present embodiment, as described above, the electrical connection with the lead pattered layer 36 is made through the conductive lead plate 42, which can eliminate the problem, as the aluminum wires, that the injected thermoplastic resin pushes the aluminum wires causing the short circuit between the adjacent aluminum wires of different potentials. However, since the control electrodes 27 of the IGBT chip 26 are spaced to each other by 1 mm or more, electrical connection between the control electrode 27 and the terminal pattered layer 38 on the insulating layer 22 may be made through the aluminum wire (conductive wire) as the conventional technique.

Also, the semiconductor device 1 of the present embodiment is described herein to include the wiring patterned layer 24 secured via the insulating layer 22 on the radiating plate 20. Alternatively, the semiconductor device 1 may include an insulating substrate of ceramic material such as alumina and aluminum nitride, which has wiring pattered layers on top and bottom surfaces (not shown), as commonly used in the art. In the case where the insulating substrate is used, reduction of the warpage of the resin package 10 according to the present invention also eliminates the problem of cracks or breakdown of the insulating substrate, thereby avoiding the reduction of the withstand voltage.

It should be noted that the present invention can be applied to any types of the semiconductor devices which control substantial amount of current and generate substantial amount of heat, for example including a MOSFET module and a diode module.

Embodiment 2

Figure 7:
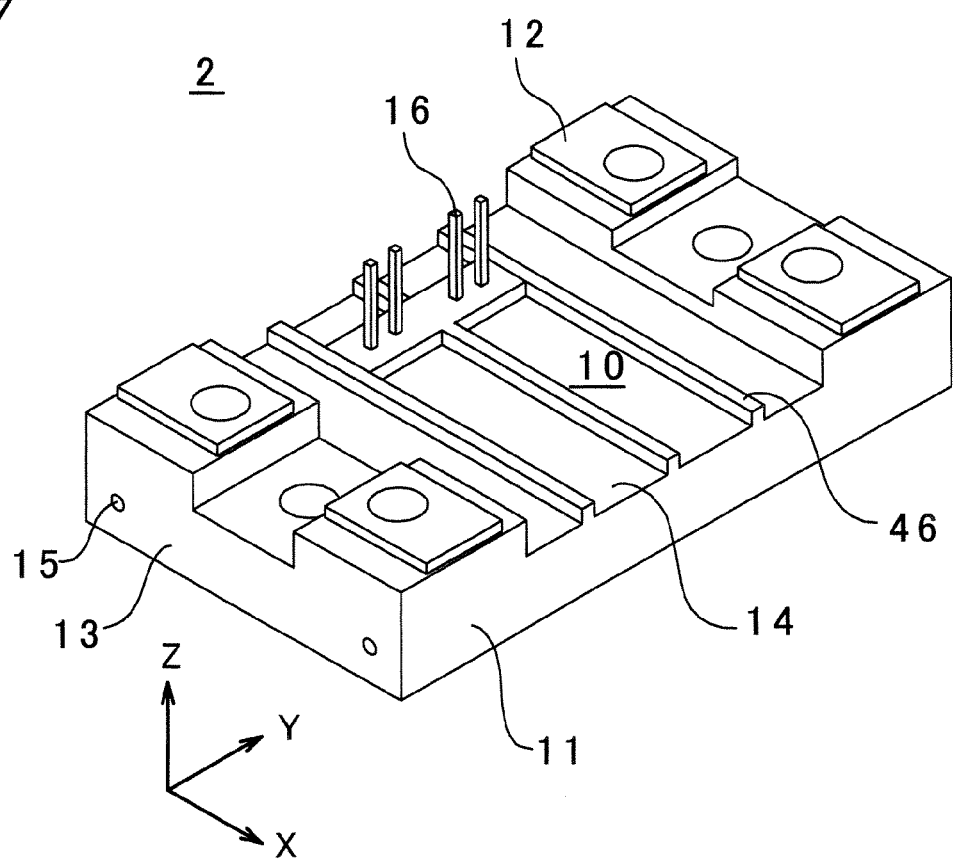
FIG. 7 is a perspective view of a semiconductor device according to the second embodiment of the present invention.

Referring to FIG. 7, a semiconductor device according to the second embodiment of the present invention will be described herein. The semiconductor device 2 of the second embodiment has components similar to those of the first embodiment except that the resin package 10 has a transverse rib 46 provided on the top surface 14 thereof extending in parallel to the conductive lead plate 42. Therefore, no duplicate description will be made for the similar components of the second embodiment, which are denoted with similar reference numerals.

As above, according to the second embodiment, the semiconductor device 2 includes one or more transverse ribs 46 (three of ribs shown in FIG. 7) formed integrally with the top surface 14 of the resin package 10, which extend in parallel to the conductive lead plate 42 in the transverse direction (X-direction). Although the present invention is not limited by size of the transverse rib 46, for example, it may be sized with 2 mm (width) and 2 mm (height) in Y-, and Z-directions, respectively.

Similar to the first embodiment, the resin package 10 of the second embodiment is formed by injecting the resin from the resin inlet 15 provided on the side 13 extending in the transverse direction (X-direction), therefore, the fiber glass is generally oriented in the longitudinal direction (Y-direction). However, when the thermoplastic resin is filled in the transverse rib 46 extending along the transverse direction, the fiber glass is likely oriented along the transverse rib 46. To this result, unlike the entire body of the resin package 10, the transverse rib 46 has the linear thermal expansion coefficient in the transverse direction (X-direction) which is greater than that in the longitudinal direction (Y-direction). Therefore, the transverse rib 46 can provide strength or force encountering the shrinking stress of the resin package 10 in the transverse direction (X-direction) so as to reduce the warpage of the resin package 10 in the transverse direction (X-direction).

Embodiment 3

Figure 8:
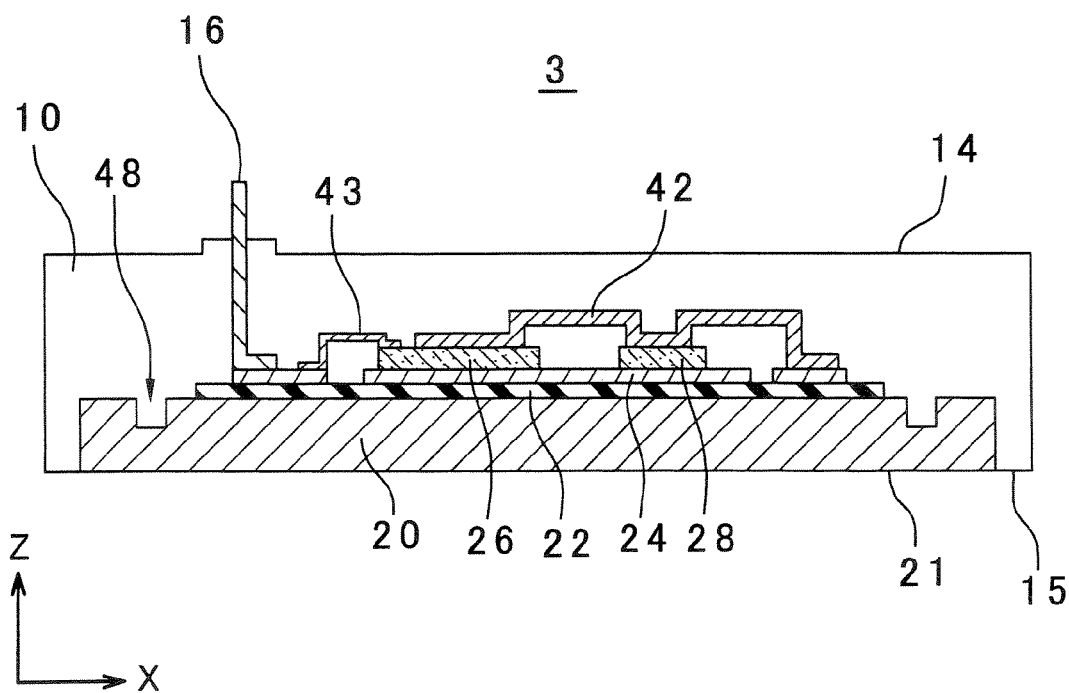
FIG. 8 is a cross sectional view of a semiconductor device according to the third embodiment, which is similar to FIG. 2.
Figure 9:
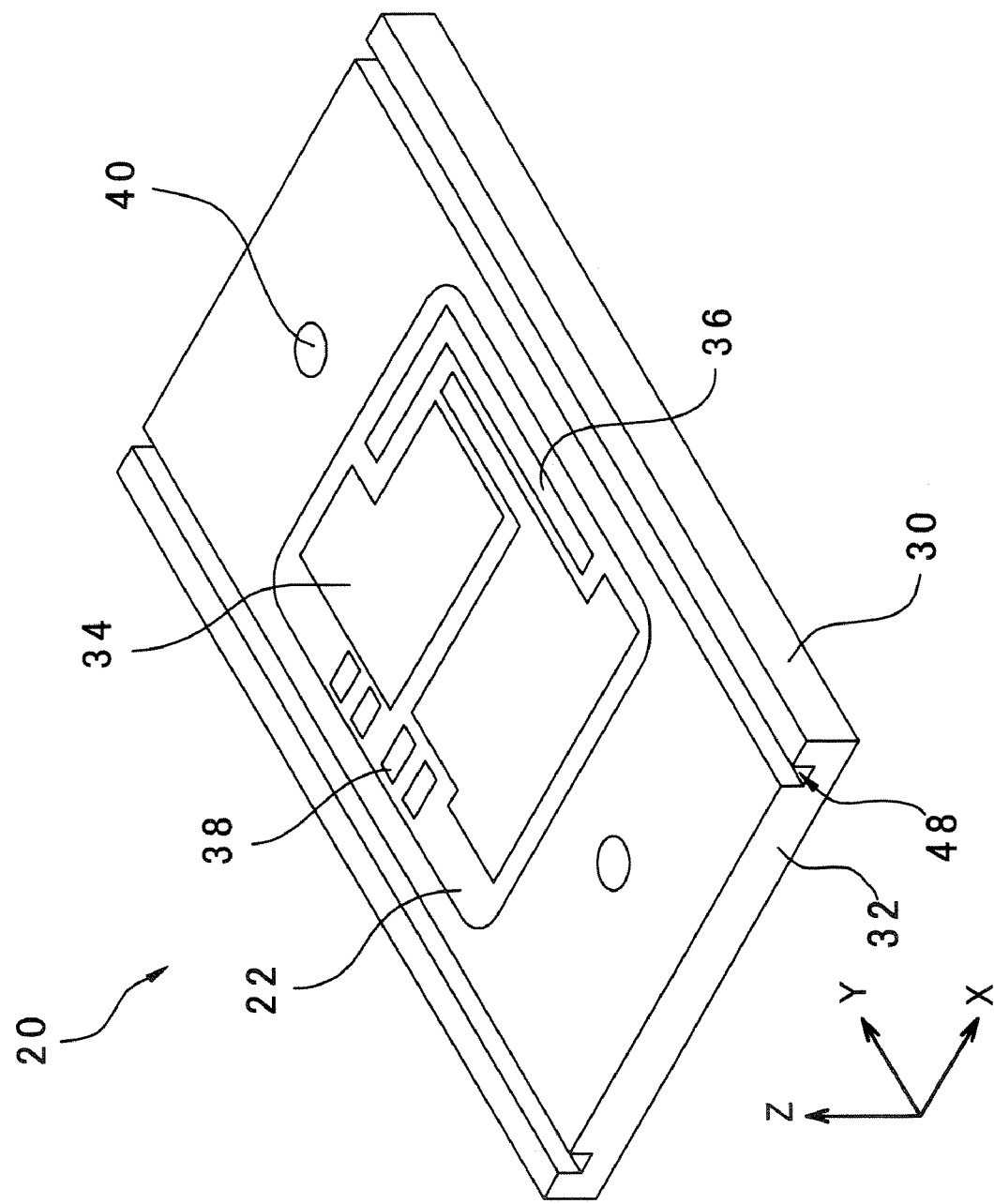
FIG. 9 is a perspective view of the radiating plate of the third embodiment, which is similar to FIG. 3.

Referring to FIGS. 8-10, a semiconductor device according to the third embodiment of the present invention will be described herein. The semiconductor device 3 of the third embodiment has components similar to those of the first embodiment except that the radiating plate 20 includes a pair of longitudinal grooves 48 which are formed adjacent opposing ends 30 thereof extending in the longitudinal direction, and filled in with the resin package 10. Therefore, no duplicate description will be made for the similar components of the third embodiment, which are denoted with similar reference numerals.

In the semiconductor device 3 of FIGS. 8 and 9, since most of fiber glass in the resin package 10 is oriented along the longitudinal direction (Y-direction), the maximum anisotropy of the linear thermal expansion coefficient of the resin package 10 is realized in the transverse direction (X-direction), similar to the first embodiment. Also, the conductive lead plate 42 having the linear expansion coefficient less than the resin package 10 in the transverse direction is arranged close to the top surface 14 of the resin package 10 which extends along the transverse direction (X-direction).

Also, in the semiconductor device 3, the radiating plate 20 includes a planner rectangular configuration defined by two pairs of opposing ends 30, 32 extending in longitudinal and transverse directions (Y and X directions), respectively, and also includes a pair of longitudinal grooves 48 formed adjacent the pair of opposing ends 30 extending in the longitudinal direction. Preferably, the longitudinal grooves 48 extend through and up to the opposing ends 32 extending in the transverse direction, as shown in FIG. 9. Although not limited thereto, the groove 48 is sized with 1 mm (width) and 1 mm (depth) in X- and Z-directions, respectively. The grooves 48 so formed are filled up with thermoplastic resin which in turn is hardened.

In the injection-molding step of the semiconductor device 3, a portion of the resin package 10 enters the grooves 48 by filling in with resin and hardening it so that the portion the resin package 10 gives strength encountering the shrinking stress of the resin package 10 in the transverse direction (X-direction) during the injection-molding step (anchoring effect). This reduces the warpage of the resin package 10 in the transverse direction (X-direction) so as to avoid the gap between the radiating plate 20 and the external heat sink, thereby keeping good radiation efficiency and preventing failure of the internal circuitry, e.g., breakdown of the insulating layer 22.

Also, in the hardening and cooling step after the injection-molding step, as the resin package 10 shrinks more than the radiating plate 20 in the transverse direction (X-direction), the portion of the resin package 10 filled in the grooves 48 is expected to serve another function for caulking the interface between the grooves 48 and the resin package 10 (caulking effect). In general, the thermoplastic resin is heated up to about 150 degrees centigrade and filled up for forming the resin package 10 during the injection-molding step, meanwhile, the radiating plate 20 is heated up to about 125 degrees centigrade during switching operation of the semiconductor device 3. Thus, during switching operation, the resin package 10 engaged in the grooves 48 of the radiating plate 20 does not expand as during the injection-molding step so that the resin package 10 is kept in a shrunk condition, thereby maintaining the caulking effect.

The anchoring and caulking effects thanks to formation of the grooves 48 avoid peeling or detachment of the insulating layer 22 beneath the semiconductor chips 26, 28 that are mounted between the grooves 48, and prevent moisture from entering through the interface between the resin package 10 and the radiating plate 20.

Figure 10A:
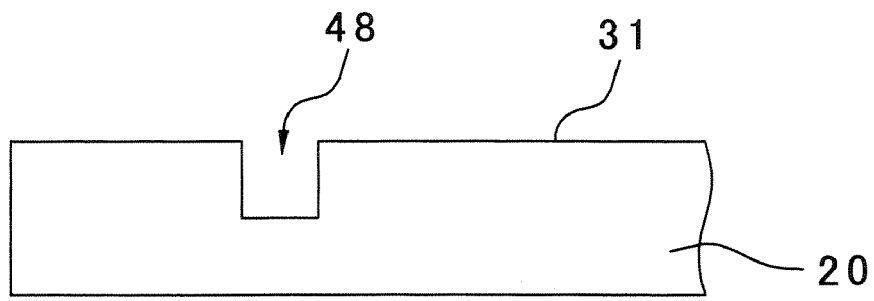
FIGS. 10A-10D are enlarged cross sectional views showing variations of the groove of FIG. 9.
Figure 10B:
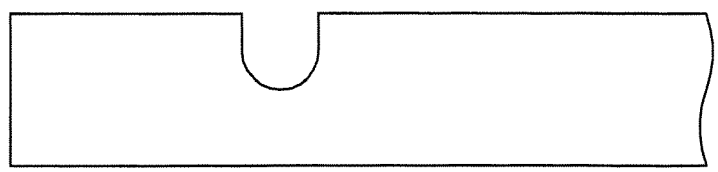
Figure 10C:
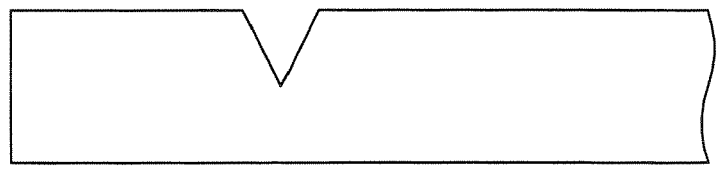
Figure 10D:
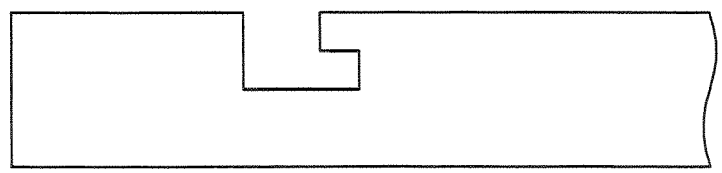

While the grooves 48 are described herein to have a rectangular cross section as illustrated in FIG. 10A, it may have any shapes of the cross section such as U-shaped and V-shaped cross sections as shown in FIGS. 10B and 10C, respectively. To absorb the warpage of the edges 32 of the radiating plate 20 in an efficient manner, the groove 48 is preferably formed to have the V-shaped cross section. Further, in order to increase the caulking effect between the resin package 10 and the radiating plate 20, the groove 48 preferably has an L-shaped cross section as shown in FIG. 10D, having an extended portion adjacent to the top surface 31 of the radiating plate 20.

In addition, although not illustrated, the radiating plate 20 may have another pair of grooves extending in the transverse direction (X-direction) adjacent another one of opposing edges 32, which realize the same effects as the grooves 48 extending in the longitudinal direction (Y-direction). Further, when the aforementioned insulating substrate is bonded on the radiating plate 20 via the solder layer, the transverse grooves can advantageously be used as markers for alignment of the insulating substrate.

Embodiment 4

Figure 11:
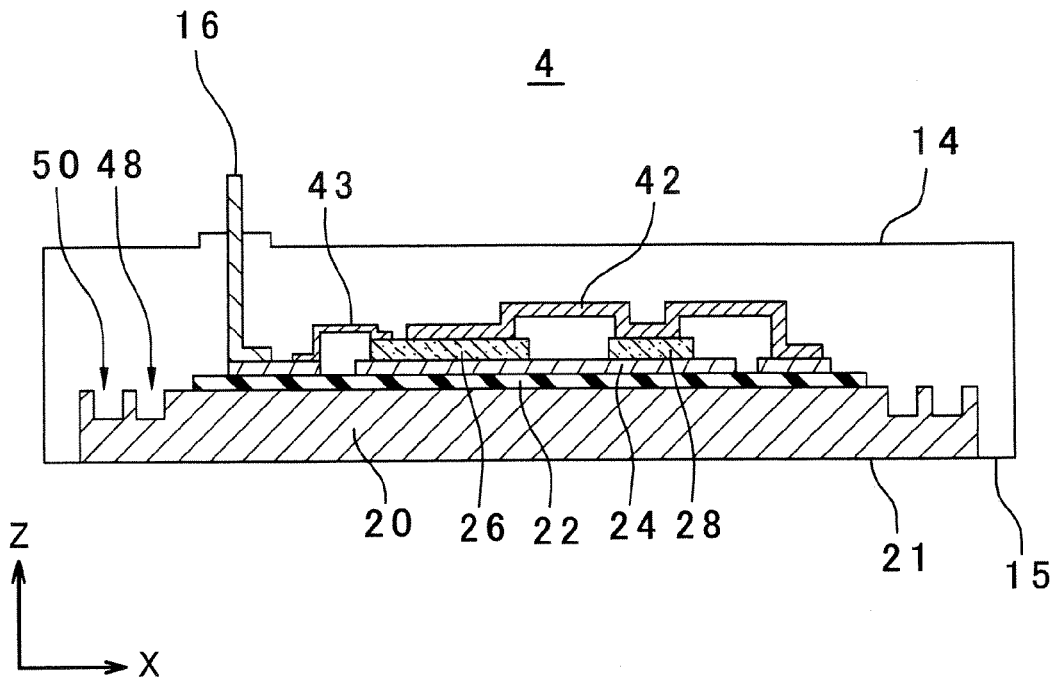
FIG. 11 is a cross sectional view of a semiconductor device according to the fourth embodiment, which is similar to FIG. 2.
Figure 12:
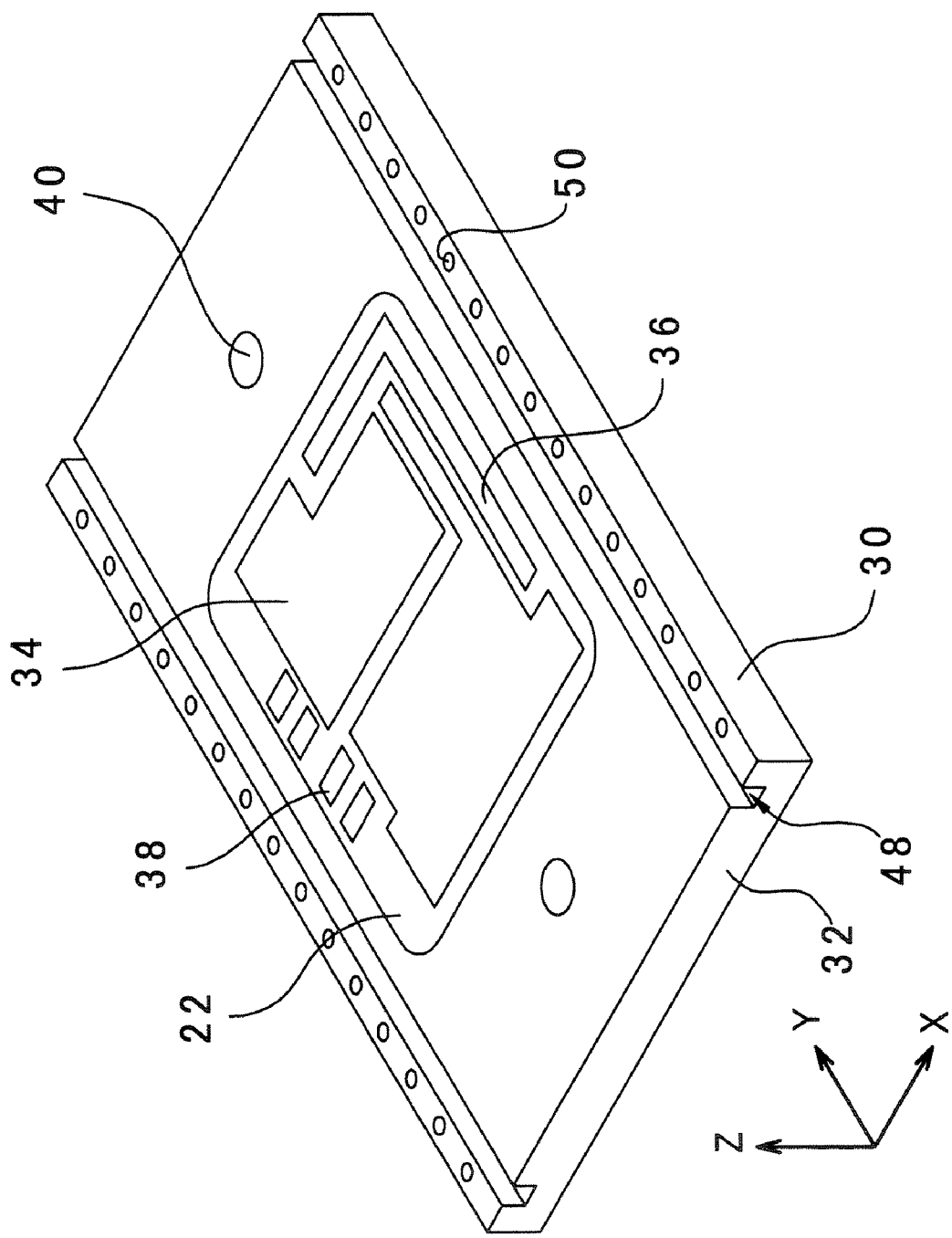
FIG. 12 is a perspective view of the radiating plate of the fourth embodiment, which is similar to FIG. 3.

Referring to FIGS. 11 and 12, a semiconductor device according to the fourth embodiment of the present invention will be described herein. The semiconductor device 4 of the fourth embodiment has components similar to those of the third embodiment except that the radiating plate 20 further includes a plurality of recesses which are formed adjacent opposing ends 30 thereof extending in the longitudinal direction, and filled in with the resin package 10. Therefore, no duplicate description will be made for the similar components of the fourth embodiment, which are denoted with similar reference numerals.

As above, in addition to the grooves 48 provided adjacent the opposing edges of the radiating plate 20 extending in the longitudinal direction as the third embodiment, the semiconductor device 4 of FIGS. 11 and 12 includes a plurality of recesses 50 which are formed adjacent the opposing ends 30 extending in the longitudinal direction. Also, the recesses 50 of the radiating plate 20 are preferably injected and filled up with the thermoplastic resin which in turn is cooled and hardened for forming the resin package 10. Although not limited thereto, the recess 50 has a planner circular view having the diameter of 1 mm in X- and Y-directions and the depth of 1 mm in Z-direction.

In general, the thermoplastic resin composing the resin package 10 has affinity with a flat surface of metal (radiating plate 20), which is less than affinity of the thermosetting resin. Thus, during the hardening and cooling step, due to difference of the linear expansion coefficients, the resin package 10 of thermoplastic resin tends to shrink relative to the radiating plate 20 more than the resin package of thermosetting resin. The grooves 48 extending along the longitudinal direction basically reduce the warpage of the resin package 10 in the transverse direction (X-direction) but gives little contribution to the warpage in the longitudinal direction (Y-direction). Therefore, even if the resin package 10 reduces the warpage in the longitudinal by orienting the fiber glass in the longitudinal direction, the warpage along the longitudinal direction cannot be completely eliminated and may be observed to some extent adjacent the edges 32, especially when the resin package 10 has a substantially elongated planner configuration. However, according to the fourth embodiment, the recesses 50 gives strength encountering the shrinking stress of the resin package 10 in the longitudinal direction (Y-direction) thereby reducing the warpage in the longitudinal direction (anchoring effect in Y-direction). To this result, the anchoring effect (warpage reduction effect) of the grooves 48 in the transverse direction (X-direction) can be equalized along the longitudinal direction (Y-direction).

As those skilled in the art can easily recognize, the recess 50 presents the anchoring effect in all directions including the longitudinal and transverse directions (Y-, and X-directions). Thus, while in the foregoing description, the recesses are formed in addition to the grooves 48, the recesses 50 alone may be formed, without the grooves 48, adjacent the edges 30 extending in the longitudinal direction. In this case, each of the recesses may be arranged such that the adjacent recesses are spaced by a small distance or gap of, e.g., 1 mm for realizing the caulking effect similar as the grooves 48.

Also, while in the above description and drawings, two pairs of the edges 30, 32 of the radiating plate 20 are fully covered by the resin package 10, as the recesses 50 present both of the anchoring effect (warpage reduction effect) and the caulking effect, the resin package may be molded exposing the edges 30, 32 of the radiating plate 20. This downsizes the semiconductor device 4 and improves the radiation efficiency through the radiating plate 20.

It should be noted that the recess 50 may have any planner shapes including not only a circle but also a polygon such as triangle and quadrangle, which is suitable for the manufacturing process of the radiating plate 50. Also, the recess 50 may be formed as through-holes extending through the bottom surface 21 of the radiating plate 50.

Embodiment 5

Figure 13:
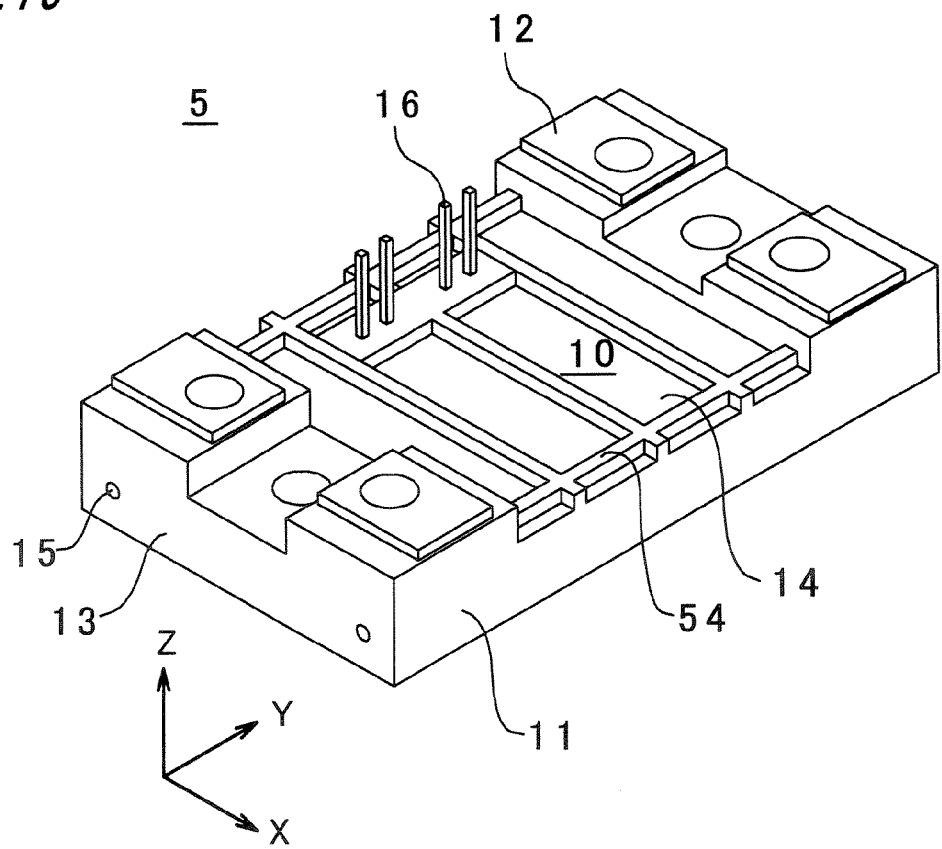
FIG. 13 is a perspective view of the semiconductor device of the fifth embodiment.

Referring to FIG. 13, a semiconductor device according to the fifth embodiment of the present invention will be described herein. The semiconductor device 5 of the fifth embodiment has components similar to those of the second embodiment except that the resin package 10 has a longitudinal rib 46 provided on the top surface 14 thereof extending in a direction perpendicular to the conductive lead plate 42. Therefore, no duplicate description will be made for the similar components of the fifth embodiment, which are denoted with similar reference numerals.

As above, according to the semiconductor device 5 of the fifth embodiment, one or more longitudinal ribs 54 (two of ribs shown in FIG. 13) are formed integrally with the top surface 14 of the resin package 10, which extend in the longitudinal direction (Y-direction) perpendicular to the conductive lead plate 42. Although the present invention is not limited by size of the longitudinal rib 54, for example, it may be sized with 2 mm (width) and 2 mm (height) in X-, and Z-directions, respectively.

Similar to the first embodiment, the resin package 10 of the fifth embodiment is formed by injecting the resin from the resin inlet 15 provided on the side 13 extending in the transverse direction (X-direction). Therefore, the fiber glass is generally oriented in the longitudinal direction (Y-direction) so that the transverse direction (X-direction) provides the resin package 10 with the maximum anisotropy of the linear expansion coefficient. However, especially in case where the semiconductor device 5 includes a lot of components such as the IGBT chip 26 and the FWD chip 28, the thermoplastic resin injected from the resin inlet 15 impinges on those components and locally disarranges the orientation of the fiber glass in the thermoplastic resin. This substantially increases the linear expansion coefficient adjacent the components in the longitudinal direction (Y-direction), in comparison with the linear expansion coefficient of the radiating plate 20, which should be corrected or improved.

In the present embodiment, when the thermoplastic resin mixed with the fiber glass is injected from the resin inlet 15, the fiber glass is likely aligned to the longitudinal rib 54. Therefore, the longitudinal rib 54 on the top surface 14 of the resin package 10 decreases the linear expansion coefficient in the longitudinal direction so that the warpage of the resin package 10 in the longitudinal direction (Y-direction) can efficiently be corrected or reduced.

Embodiment 6

Figure 14:
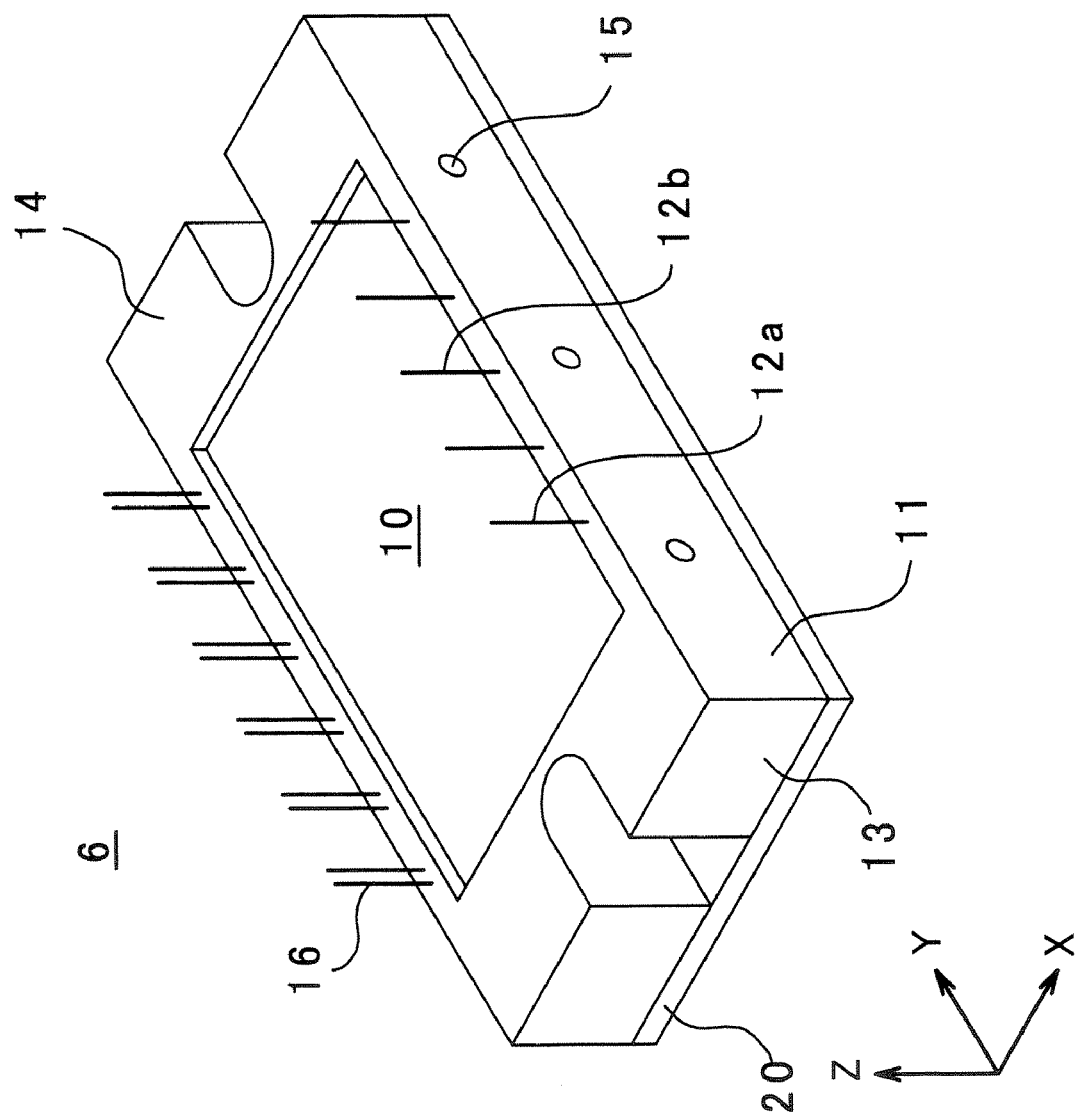
FIG. 14 is a perspective view of the semiconductor device of the sixth embodiment.
Figure 15:
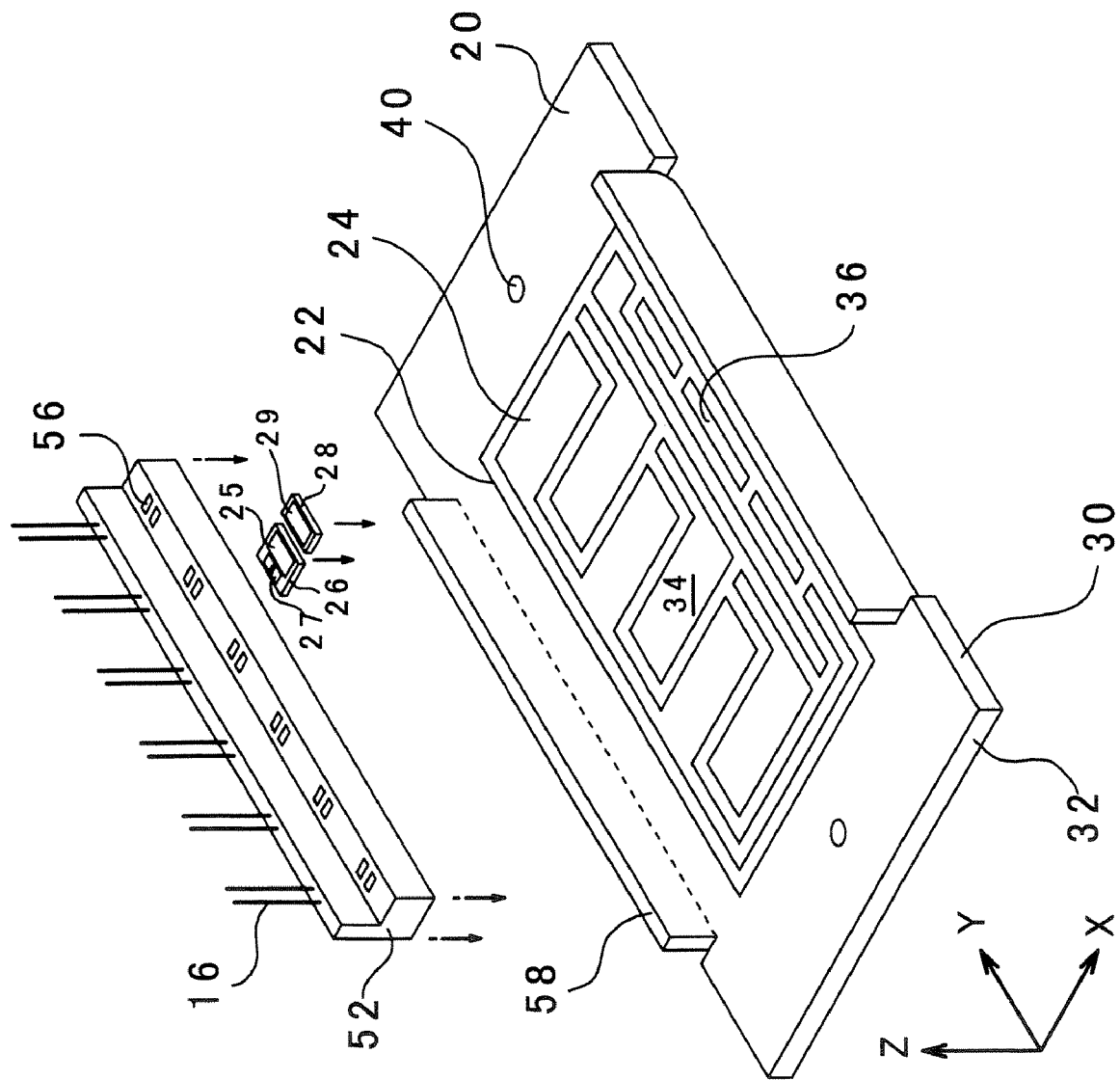
FIG. 15 is a perspective view of the radiating plate of the sixth embodiment.

Referring to FIGS. 14 and 15, a semiconductor device according to the sixth embodiment of the present invention will be described herein. While each of the semiconductor devices 1-5 of the first to fifth embodiments includes a single phase of high and low potential inverter circuitries, the semiconductor devices 6-8 of the sixth to eighth embodiments includes three phases (U-, V-, W-phases) of high and low potential inverter circuitries. Beside, since the semiconductor device 6 has components similar to those of the first embodiment, no duplicate description will be made for the similar components of the first embodiment, which are denoted with similar reference numerals.

In FIG. 14, the semiconductor device 6 of the sixth embodiment includes a radiating plate 20, a molded resin package 10, a plurality of DC (direct current) source terminals 12a, AC (alternate current) drive terminals 12b, and signal terminals 16. The resin package 10 of the semiconductor device 6 is formed by injecting thermoplastic resin mixed with fiber glass in the transverse direction (X-direction) from a resin inlet 15 that is provided on the side 11 extending in the longitudinal direction (Y-direction).

In FIG. 15, the radiating plate 20 includes a pair of through-holes 40 receiving fastening members such as screws for fastening the semiconductor device 6 onto the external heat sink via silicone grease (both not shown), and the wiring patterned layer 24 secured thereon through the insulating layer (insulating substrate) 22. The wiring patterned layer 24 has six of the island patterned layers 34, on which three phases of the high and low potential inverter circuitries (i.e., IGBT chips 26 and FWD chips 28) are mounted. In FIG. 15, one of IGBT chips 26 and FWD chips 28 are illustrated over the island patterned layer 34.

The semiconductor device 6 of the sixth embodiment also includes a connector 52 having a plurality of connecter terminals 56, each of which is electrically connected with the control electrode of the IGBT chip 26. Also, the connector 52 is secured on the radiating plate 20.

Electrical connection between the lead patterned layer 36 and the emitter electrode 25 of the IGBT chip 26/the anode electrode 29 of the FWD chip 28 mounted on the island patterned layer 34 may be made by means of the conductive lead plate 42 as shown in FIGS. 4 and 6, or alternatively, may be made with conventional aluminum wires (conductive lead wires). In the context of the present application, the conductive lead plate and the conductive lead wires are collectively referred to as a conductive lead member. Also, it should be noted that if the aluminum wires are used for the electrical connection, the aluminum wires are preferably covered with resin having small amount of ionic components, for protecting the aluminum wires from high temperature and pressure of the molding thermoplastic resin.

As above, since the resin package 10 of the sixth embodiment is formed by injecting the thermoplastic resin with fiber glass in the transverse direction (X-direction) from the resin inlet 15 that is arranged on the side 11 extending in the longitudinal direction (Y-direction), most of fiber glass in the resin package 10 is oriented along the transverse direction (X-direction), the maximum anisotropy of the linear expansion coefficient of the resin package 10 is obtained in the longitudinal direction (Y-direction). Thus, in view of the anisotropy of the linear expansion coefficient, the resin package 10 of the sixth embodiment warps more in the longitudinal direction (Y-direction) rather than the transverse direction (X-direction).

To address the warpage of the resin package 10 in longitudinal direction (Y-direction), the radiating plate 20 of the sixth embodiment includes a pair of bent member 58, each of which is formed by cutting the opposing edge 30 extending in the longitudinal direction (Y-direction) and by raising upwardly (Z-direction), as illustrated in FIG. 15.

The bent members 58 of the radiating plate 20 give strength or force encountering the shrinking stress of the resin package 10 in the longitudinal direction (Y-direction) so as to reduce the warpage of the resin package 10 in the longitudinal direction. Therefore, this avoids formation of the gap between the radiating plate 20 and the external heat sink, thereby keeping good radiation efficiency and preventing failure of the internal circuitry, e.g., breakdown of the insulating layer 22.

Instead of the bent members 58 of the radiating plate 20, a stress reducing member of material having the linear expansion coefficient less than that of the resin package 10 at least in the longitudinal direction (Y-direction) may be separately prepared and secured on the radiating plate 20 to achieve the same function as the bent member 58. However, in order to manufacture the semiconductor device 6 in a cost-effective and readily manner, the bent member 58 is more preferable because the number of components can be reduced.

Figure 16:
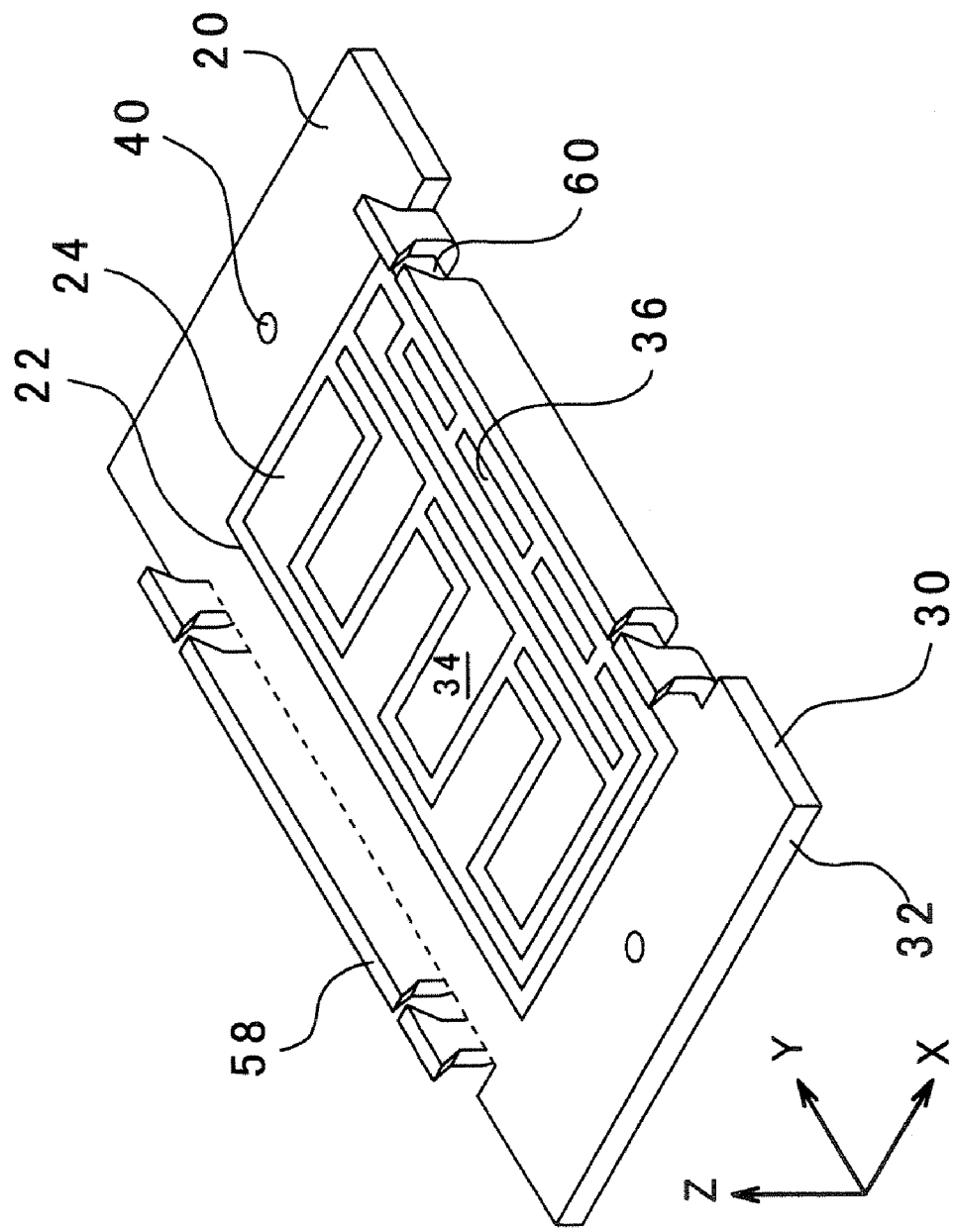
FIG. 16 is a perspective view of the modified radiating plate of the sixth embodiment.
Figure 17:
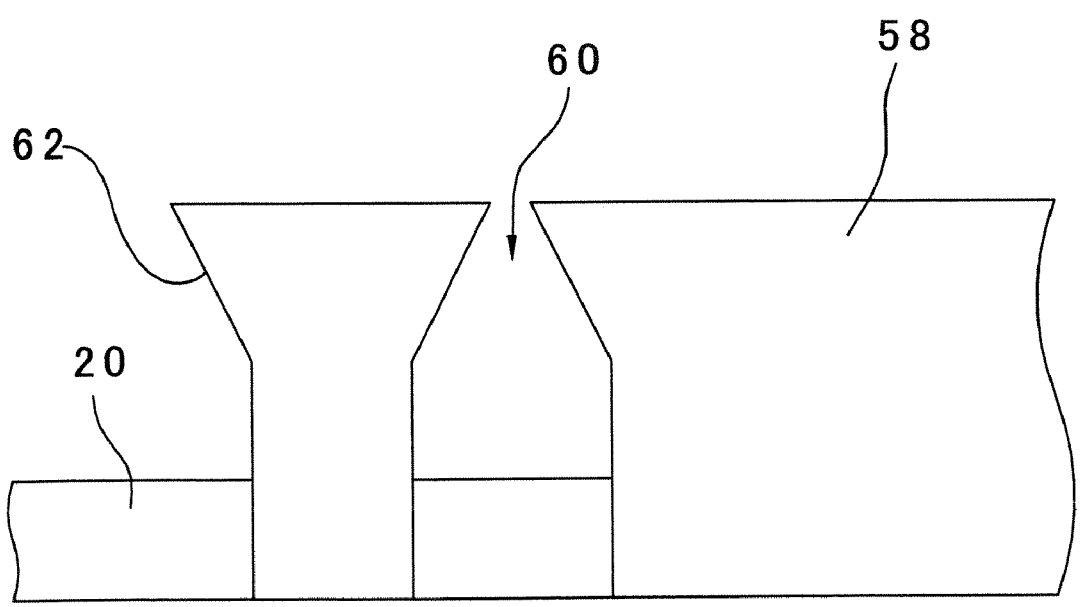
FIG. 17 is an enlarged side view of the bent portion of FIG. 16.

The bent member 58 of the radiating plate 20 may include cut-out portions 60 as shown in FIG. 16. Since the thermoplastic resin is filled in the cut-out portions 60, the contacting surface between the resin package 10 and the bent member of the radiating plate 20 is increased, thereby improving the affinity and the warpage reduction effect (anchoring effect) therebetween. To further improve the affinity, each of the cut-out portions 60 preferably includes tapered edges 62 inclined to the radiating plate 20 when viewing in the transverse direction (in the Y-Z plane), as illustrated in FIG. 17.

Figure 18:
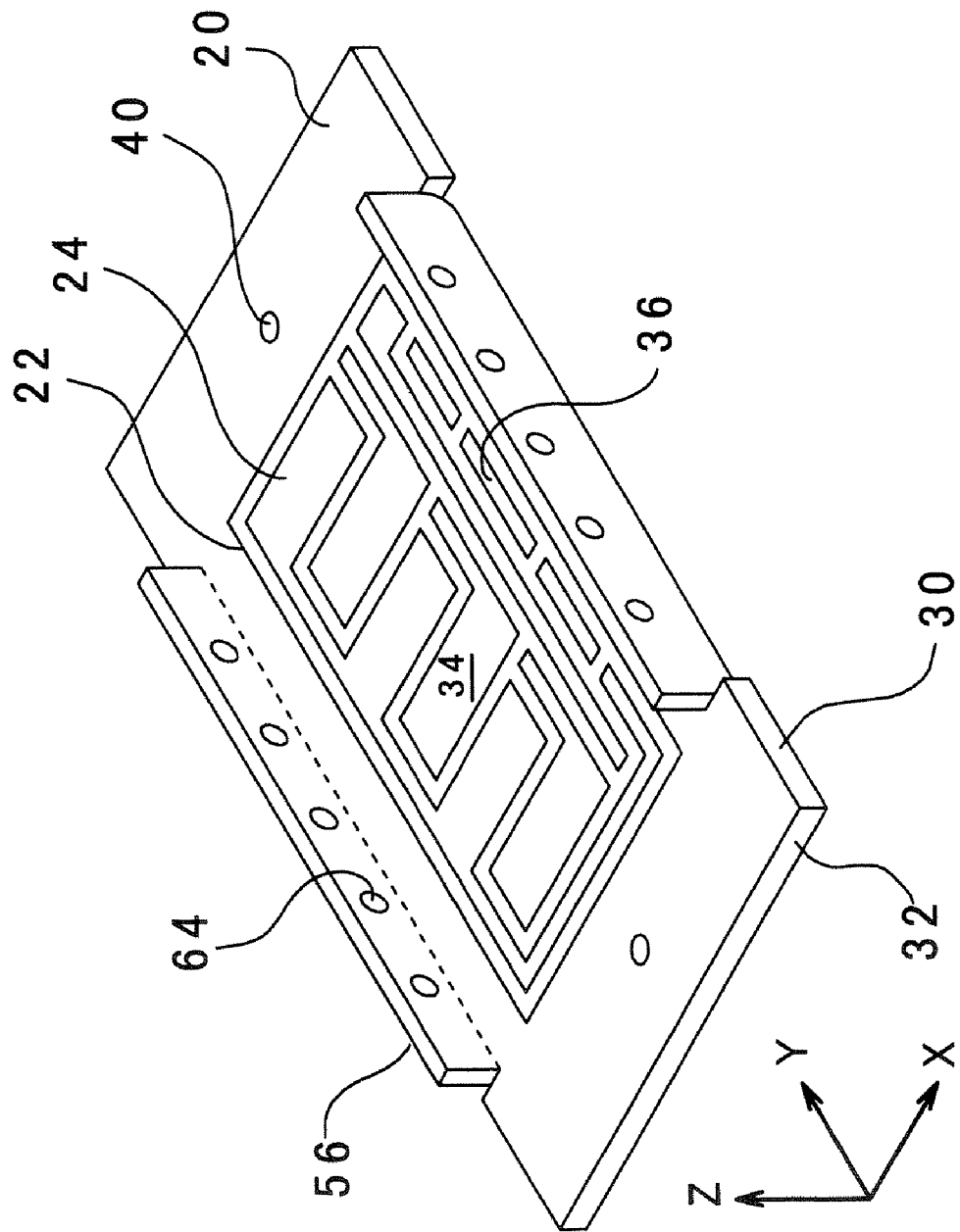
FIG. 18 is a perspective view of the modified radiating plate of the sixth embodiment.

Alternatively, the bent member 58 of the radiating plate 20 may include a plurality of through-holes 64 as shown in FIG. 18. Similar to the cut-out portions 60 described above, the thermoplastic resin filled in the through-holes 64 increases the contacting surface between the resin package 10 and the bent member of the radiating plate 20, thereby improving the affinity and the warpage reduction effect (anchoring effect) therebetween.

In the foregoing description, upon formation of the resin package 10, the thermoplastic resin is injected in the transverse direction from the resin inlet provided on the side extending in the longitudinal direction, however, it may be injected in the longitudinal direction (Y-direction) from the resin inlet provided on the side 13 extending in the transverse direction (X-direction). In this case, the edges 32 of the radiating plate 20 are partially cut and raised so as to form the bent members extending in the longitudinal direction (Y-direction).

Embodiment 7

Figure 19:
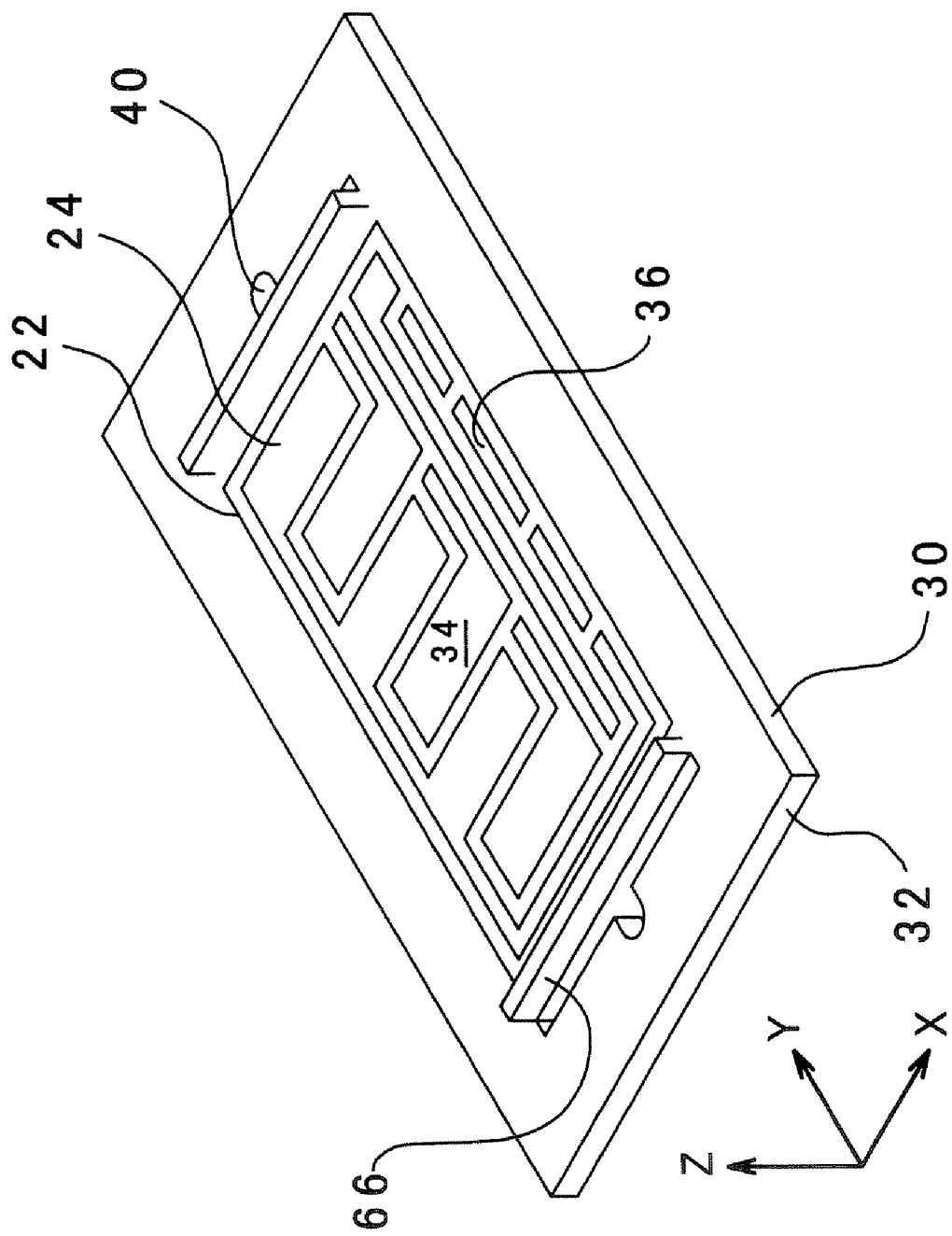
FIG. 19 is a perspective view of the radiating plate of the seventh embodiment.

Referring to FIG. 19, a semiconductor device according to the seventh embodiment of the present invention will be described herein. The semiconductor device 7 of the seventh embodiment has components similar to those of the sixth embodiment Therefore, no duplicate description will be made for the similar components of the fifth embodiment, which are denoted with similar reference numerals.

Unlike the sixth embodiment, the resin package 10 of the seventh embodiment is formed by injecting the thermoplastic resin in the longitudinal direction (Y-direction) from the resin inlet (not shown) provided on the side 13 extending in the transverse direction (X-direction)

Also, the conventional conductive lead wires (not shown) such as aluminum wires are used for electrical connection between the control electrode 27 of the IGBT chip 26 and the connecter terminal 56 of the connecter 52, and for electrical connection between the lead patterned layer 36 and the emitter electrode 25 of the IGBT chip 26 (and the anode electrode 29 of the FWD chip 28). It should be noted that the conventional conductive lead wires extend substantially in the transverse direction (X-direction).

The thermoplastic resin injected in the longitudinal direction (Y-direction) might press the conductive lead wires from the side thereof, i.e., in the longitudinal direction (X-direction) perpendicular to the extension direction thereof, to cause a short circuit between adjacent conductive lead wires having different potentials. However, according to the present embodiment, a protruding member 66 is provided between the resin inlet and the conductive lead wires, as illustrated in FIG. 19, for preventing the conductive lead wire from being pressed by the injected thermoplastic resin and from contacting with another conductive lead wire due to deformation thereof.

The protruding member 66 may be separately prepared with material having the linear expansion coefficient less than that of the resin package 10 at least in the longitudinal direction (Y-direction), and secured on the radiating plate 20 with some height in the perpendicular direction (Z-direction). Preferably, the protruding member 66 is formed by cutting and raising portions of the radiating plate 20, as the bent member of the sixth embodiment, so as to reduce the number of components, thereby manufacturing the semiconductor device 7 in a cost-effective and readily manner.

Embodiment 8

Figure 20:
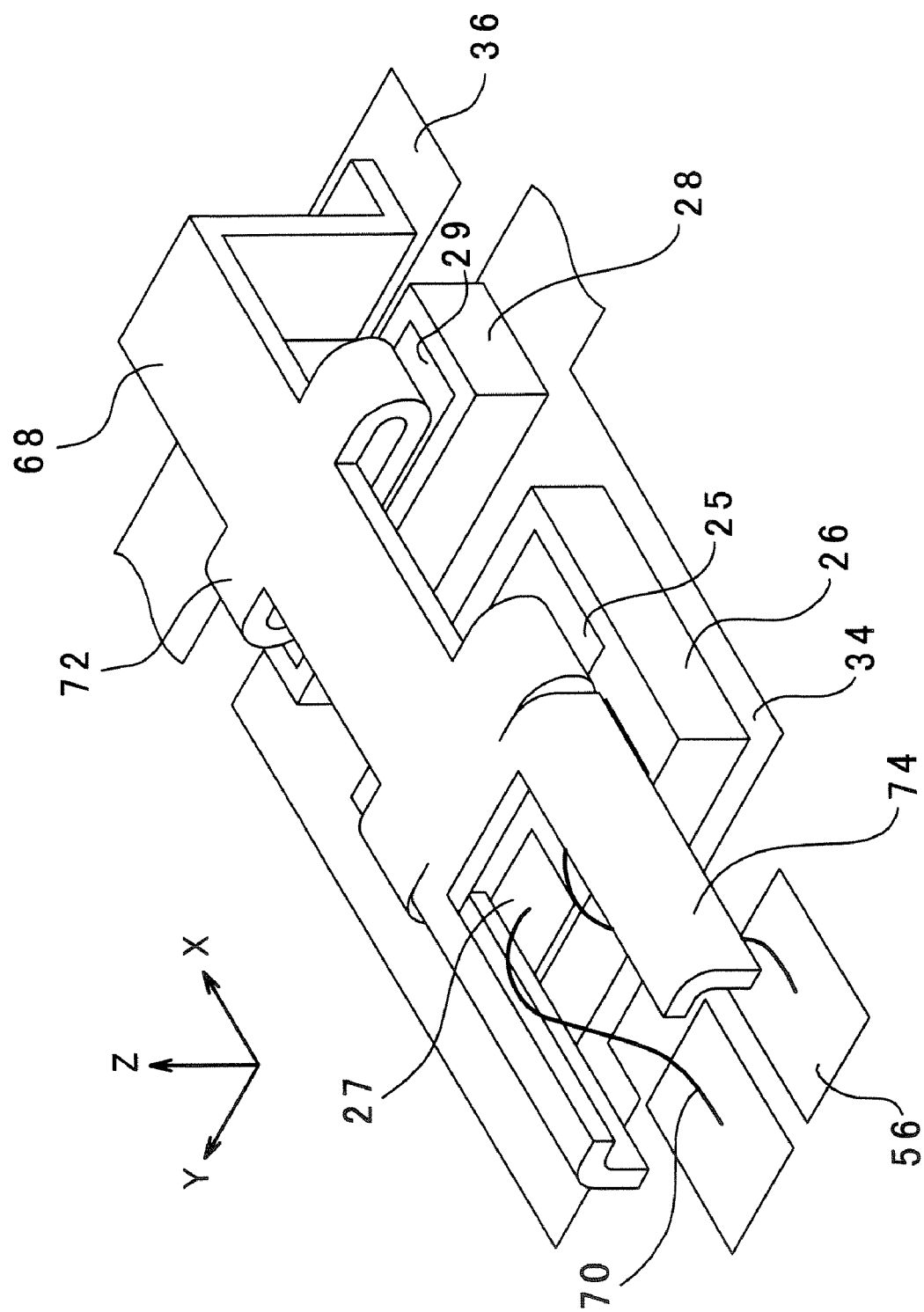
FIG. 20 is a perspective view of the conductive lead plate of the eighth embodiment.

Referring to FIG. 20, a semiconductor device according to the eighth embodiment of the present invention will be described herein. The semiconductor device 8 of the eighth embodiment has components similar to those of the seventh embodiment except that a conductive lead plate 68 is used for electrical connection between the lead patterned layer 36 and the emitter electrode 25 of the IGBT chip 26/the anode electrode 29 of the FWD chip 28, and a conventional conductive lead wire 70 is incorporated for electrical connection between the control electrode 27 of the IGBT chip 26 and the connecter terminal 56 of the connecter 52. Therefore, no duplicate description will be made for the similar components of the seventh embodiment, which are denoted with similar reference numerals.

In the eighth embodiment, the thermoplastic resin is injected in the longitudinal direction (Y-direction). As described above and illustrated in FIG. 20, electrical connection between the control electrode 27 of the IGBT chip 26 and the connecter terminal 56 of the connecter 52 is made through the conductive lead wire 70, while electrical connection between the lead patterned layer 36 and the emitter electrode 25 of the IGBT chip 26/the anode electrode 29 of the FWD chip 28 is made by means of the conductive lead plate 68 (and a U-shaped curved portion 72 thereof).

The conductive lead plate 68 of the present embodiment has a pair of elongated portions 74 covering at least a portion of the conductive lead wire 70 for protecting thereof from the flow of the thermoplastic resin injected in the longitudinal direction (Y-direction). This prevents the conductive lead wire 70 from being deformed by the flow of the thermoplastic resin, thereby eliminating the failure e.g., the short circuit failure, of the semiconductor device 8.

What is claimed is:

1. A semiconductor device, comprising:
a radiating plate;
a wiring patterned layer on said radiating plate via an insulating layer;
at least two semiconductor chips mounted on said wiring patterned layer, each of said semiconductor chips having a surface electrode;
a conductive lead plate having the greatest dimension in a first direction among three orthogonal directions, and electrically connecting the surface electrodes of said semiconductor chips arranged along the first direction; and
a resin package of thermoplastic resin having the maximum linear expansion coefficient in a second direction, said resin package covering said wiring patterned layer, said semiconductor chips, said conductive lead plate, and at least a portion of said radiating plate, wherein said first and second directions are substantially the same directions.

2. The semiconductor device according to claim 1, wherein said resin package has two pairs of opposing sides extending in longitudinal and transverse directions, respectively, said resin package being formed by injecting thermoplastic resin from a resin inlet provided on one side extending in the transverse direction; and wherein said conductive lead plate extends in the transverse direction.

3. The semiconductor device according to claim 1, wherein said conductive lead plate has a linear expansion coefficient not exceeding one of said radiating plate.

4. The semiconductor device according to claim 1, wherein said resin package has a bottom surface adjacent said radiating plate and a top surface opposing to the bottom surface, and further includes a transverse rib on the top surface thereof extending in a direction parallel to the said conductive lead plate.

5. The semiconductor device according to claim 2, wherein said radiating plate includes two pairs of opposing ends extending in the longitudinal and transverse directions, respectively, and further includes a pair of longitudinal grooves formed adjacent the opposing ends extending in the longitudinal direction; and wherein the longitudinal grooves are filled up with said resin package.

6. The semiconductor device according to claim 2, wherein said radiating plate includes two pairs of opposing ends extending in the longitudinal and transverse directions, respectively, and further includes a plurality of recesses formed adjacent the opposing ends extending in the longitudinal direction; and wherein the recesses are filled up with said resin package.

7. The semiconductor device according to claim 1, wherein said resin package has a bottom surface adjacent said radiating plate and a top surface opposing to the bottom surface, and further includes a longitudinal rib on the top surface thereof extending in a direction perpendicular to the said conductive lead plate.

8. The semiconductor device according to claim 1, wherein said resin package is made of thermoplastic resin with fiber glass.

9. The semiconductor device according to claim 1, wherein the conductive lead plate is arranged close to the top surface of the resin package such that a gap between the top surface and the conductive lead plate is one-third or less of the space between the top surface and the radiating plate.

* * * * *